United States Patent
Garcia et al.

(10) Patent No.: US 7,143,527 B2
(45) Date of Patent: Dec. 5, 2006

(54) SYSTEM AND METHOD FOR MODULATING FLOW THROUGH MULTIPLE PORTS IN A PROXIMITY HEAD

(75) Inventors: James P. Garcia, Santa Clara, CA (US); Fred C. Redeker, Fremont, CA (US); John de Larios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/273,853

(22) Filed: Nov. 14, 2005

(65) Prior Publication Data

US 2006/0064895 A1    Mar. 30, 2006

Related U.S. Application Data

(62) Division of application No. 10/957,092, filed on Sep. 30, 2004, now Pat. No. 7,003,899.

(51) Int. Cl.
*F26B 21/10*    (2006.01)
(52) U.S. Cl. .............................. 34/380; 34/397; 34/78; 134/902
(58) Field of Classification Search .................. 34/380, 34/397, 78; 134/902
See application file for complete search history.

(56) References Cited

U.S. PATENT DOCUMENTS

| | | | |
|---|---|---|---|
| 4,838,289 A | 6/1989 | Kottman et al. | |
| 5,271,774 A | 12/1993 | Leenaars et al. | |
| 5,705,223 A | 1/1998 | Bunkofske | |
| 5,945,351 A | 8/1999 | Mathuni | |
| 5,997,653 A | 12/1999 | Yamasaka | |
| 6,230,722 B1 | 5/2001 | Kenichi et al. | |
| 6,398,975 B1 | 6/2002 | Mertens et al. | |
| 6,491,764 B1 | 12/2002 | Mertens et al. | |
| 7,003,899 B1 * | 2/2006 | Garcia et al. | 34/566 |

FOREIGN PATENT DOCUMENTS

| | | |
|---|---|---|
| JP | 02280330 | 11/1990 |
| JP | 02309638 | 12/1990 |
| JP | 11350169 | 12/1999 |
| WO | WO 02/32825 | 4/2002 |

\* cited by examiner

*Primary Examiner*—S. Gravini
(74) *Attorney, Agent, or Firm*—Martine Penilla & Gencarella, LLP

(57) ABSTRACT

A method of forming a dynamic liquid meniscus includes forming a meniscus at a first size, the meniscus being formed between a proximity head and a first surface and changing the meniscus to a second size by modulating a flow through at least one of a set of ports on the proximity head. A system for modulating flow through the ports in a proximity head is also described.

20 Claims, 20 Drawing Sheets

SYSTEM AND METHOD FOR MODULATING FLOW THROUGH MULTIPLE PORTS IN A PROXIMITY HEAD

CROSS REFERENCE TO RELATED APPLICATIONS

This application is a divisional of and claims priority from U.S. patent application Ser. No. 10/957,092 filed on Sep. 30, 2004 now U.S. Pat. No. 7,003,899 and entitled "System and Method for Modulating Flow Through Multiple Ports in a Proximity Head," which is incorporated herein by reference in its entirety.

BACKGROUND

The present invention relates generally to semiconductor manufacturing processes, and more particularly, to methods and systems for performing wet processes on a surface of a substrate.

In the semiconductor chip fabrication process, it is well known that there is a need to clean and dry a wafer where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder that pushes a wafer surface against a polishing surface. The polishing surface uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after a fabrication operation that leaves unwanted residues. Typically a wet cleaning and/or rinsing process is used to remove the unwanted residues. Such a wet clean process can use water, DIW or other cleaning fluids and chemistries.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form spots). To prevent evaporation from taking place, the cleaning fluid must be removed as quickly as possible without allowing droplets to form on the wafer surface. In an attempt to accomplish this, one of several different drying techniques are employed such as spin-drying, IPA, or Marangoni drying. All of these drying techniques utilize some form of a moving liquid/gas interface on a wafer surface, which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface.

The most prevalent drying technique used today is spin rinse drying (SRD). FIG. 1 illustrates movement of cleaning fluids on a wafer 10 during an SRD drying process. In this drying process, a wet wafer is rotated at a high rate by rotation 14. In SRD, by use of centrifugal force, the water or cleaning fluid used to clean the wafer is pulled from the center of the wafer to the outside of the wafer and finally off the edge of the wafer as shown by fluid directional arrows 16. As the cleaning fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG. 1, the inside area of the circle formed by the moving liquid/gas interface 12 is free from the fluid and the outside area of the circle formed by the moving liquid/gas interface 12 is the cleaning fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the cleaning fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed above. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces.

Therefore, there is a need for a method and an apparatus that avoids the prior art by allowing quick and efficient cleaning and drying of a surface of a semiconductor wafer or other substrate, but at the same time reduces the formation of numerous water or cleaning fluid droplets that may cause contamination to deposit on the surface. Such deposits can substantially reduce the yield of acceptable wafers and thereby increase the cost of manufacturing semiconductor wafers.

SUMMARY OF THE INVENTION

Broadly speaking, the present invention fills these needs by providing a system and method of modulating the flow though multiple ports in a proximity head. It should be appreciated that the present invention can be implemented in numerous ways, including as a process, an apparatus, a system, computer readable media, or a device. Several inventive embodiments of the present invention are described below.

One embodiment provides a method of forming a dynamic liquid meniscus includes forming a meniscus at a first size, the meniscus being formed between a proximity head and a first surface and changing the meniscus to a second size by modulating a flow through at least one of a set of ports in the proximity head.

The meniscus can be formed on the first surface and the meniscus is expanded to the second size. The second size is formed between the proximity head and at least a portion of a second surface, the second surface being a surface to be processed.

The first size can be smaller than the second size. The method can also include contracting the meniscus to a minimum size. The method can also include terminating the meniscus. The minimum size meniscus can be formed between the first surface and the proximity head and the first surface is not a surface to be processed.

Changing the meniscus to the second size by modulating the flow through at least one of the ports in the proximity head can include moving the meniscus relative to the proximity head. Changing the meniscus to the second size by modulating the flow through at least one of the in the proximity head can include changing a respective total flow rate supplied to the plurality of ports. The method can also include processing the first surface including moving the first surface relative to the proximity head. The proximity head can be stationary or movable, relative to the first surface.

The meniscus can be changed to the second size by modulating the flow through at least one of the ports in the proximity head with a flow control worm. The flow control worm can have a width equal to or greater than a port width of each one of the ports in the proximity head. The width of flow control worm can be constant or variable along a length of the flow control worm.

Another embodiment provides a proximity head system for flowing fluids to and from a surface of a substrate so as to define a meniscus. The proximity head includes multiple ports for flowing the fluids to and from the surface of the substrate and a flow control worm for enabling and disabling selected ones of the ports.

The system can also include a conduit. The conduit being aligned with at least some of the ports and wherein the flow control worm is configured to pass through the conduit to enable the enabling and disabling of the selected ones of the ports. The system can also include a pair of pulleys for driving the flow control worm. The pair of pulleys can include a drive pulley and a tension pulley.

The flow control worm can be defined as a continuous loop. The continuous loop has a first section of a first dimension and a second section of a second dimension. The first dimension can be greater than the second dimension.

The flow control worm can also include multiple beads. The flow control worm can include a shaft and multiple valves. The multiple valves are at least one of a group consisting of a butterfly-type valve or a ball-type valve. Each one of the valves are mechanically coupled together. Each one of the valves can be actuated independent of one another.

Yet another embodiment provides a proximity head system for flowing fluids to and from a surface of a substrate so as to define a meniscus. The proximity head including a set of ports for flowing the fluids to and from the meniscus formed between the proximity head and the surface of the substrate, each one of the ports including a corresponding one of a set of valves.

Still another embodiment includes a method of forming a dynamic liquid meniscus. The method includes forming a meniscus at a first size. The meniscus being formed between a proximity head and a first surface. The proximity head having multiple ports. A first set of fluid flow rates is supplied to the meniscus through the ports. The first set of fluid flow rates is changed to a second set of fluid flow rates by modulating a flow through at least one of the ports in the proximity head.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings.

DETAILED DESCRIPTION OF THE EXEMPLARY EMBODIMENTS

Several exemplary embodiments for modulating the flow though multiple ports in a proximity head will now be described. It will be apparent to those skilled in the art that the present invention may be practiced without some or all of the specific details set forth herein.

Part I: Proximity Head Processing

Various systems and methods of processing a surface such as a semiconductor wafers or other substrates, using a proximity head to manipulate one or more dynamic liquid meniscus has been described in the following co-pending, co-owned patent applications, each of which is incorporated by reference in their entirety for all purposes: U.S. patent application Ser. No. 10/261,839 filed on Sep. 30, 2002 and entitled "METHOD AND APPARATUS FOR DRYING SEMICONDUCTOR WAFER SURFACES USING A PLURALITY OF INLETS AND OUTLES HELD IN CLOSE PROXIMITY TO THE WAFER SURFACES." U.S. patent application Ser. No. 10/330,843 filed on Dec. 24, 2002 and entitled "MENISCUS, VACUUM, IPA VAPOR, DRYING MANIFOLD." U.S. patent application Ser. No. 10/404,692 filed on Mar. 31, 2003 and entitled "METHODS AND SYSTEMS FOR PROCESSING A SUBSTRATE USING A DYNAMIC LIQUID MENISCUS."

Figure 1:
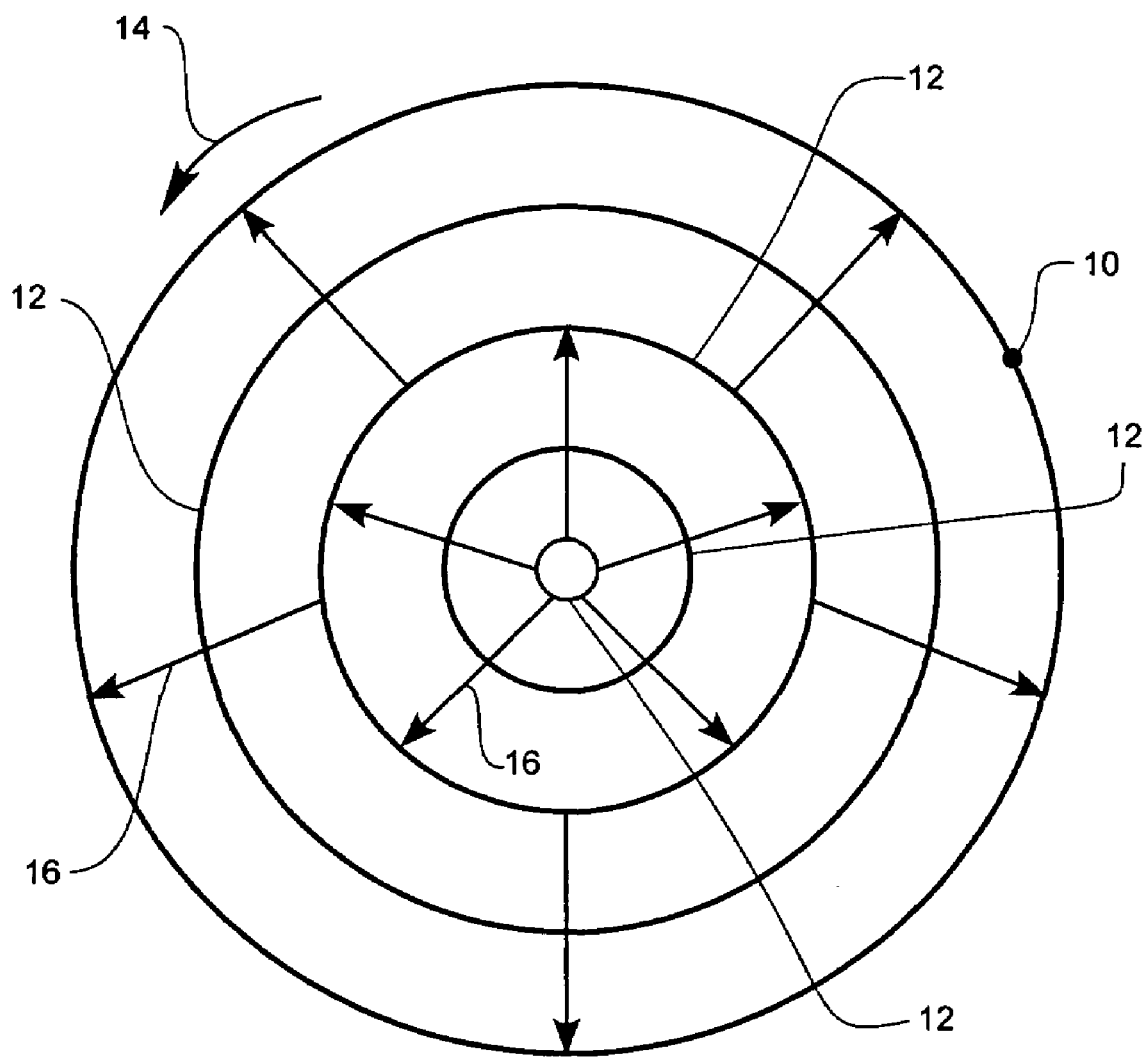
FIG. 1 illustrates movement of cleaning fluids on a wafer during an SRD drying process.
Figure 2A:
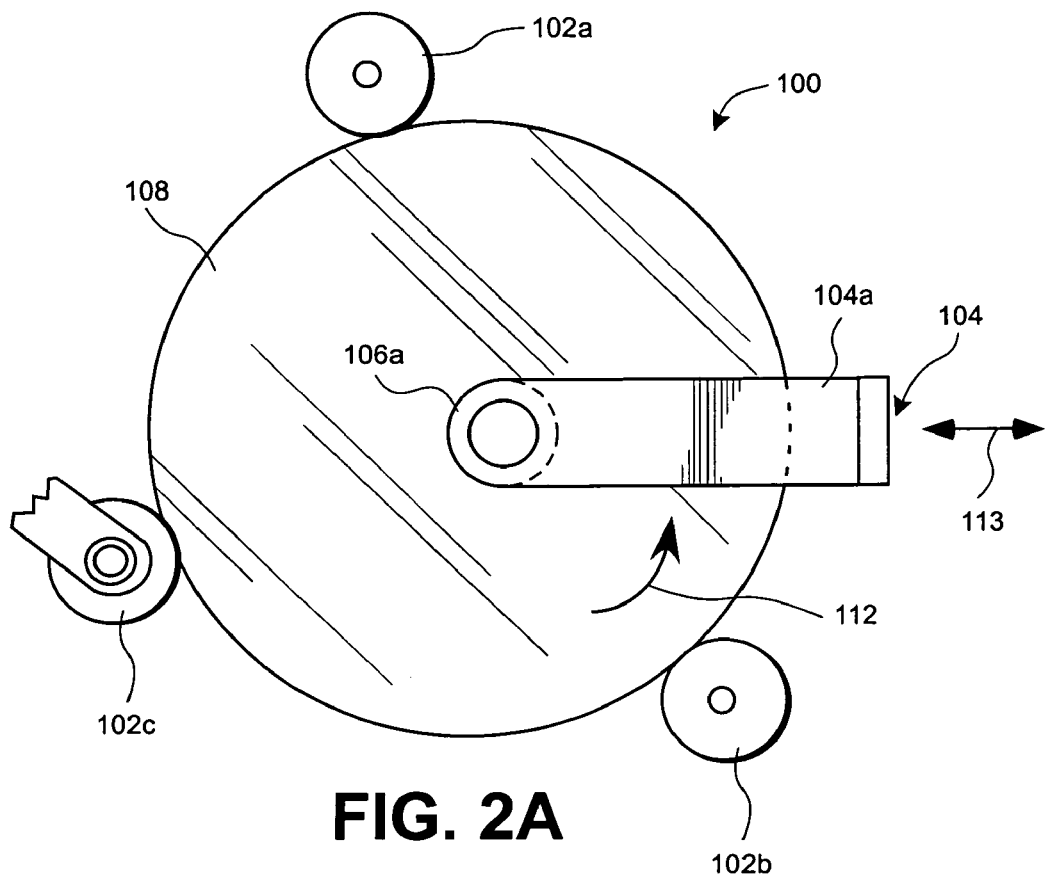
FIG. 2A is a top view of a wafer processing system with dual proximity heads in accordance with one embodiment of the present invention.

FIG. 2A is a top view of a wafer processing system 100 with dual proximity heads in accordance with one embodiment of the present invention. An upper arm 104a can be configured to move and hold the proximity head 106a in a position in close proximity over the wafer 108. The upper arm 104a may also be configured to move the proximity head 106a from a center portion of the wafer 108 towards the edge of the wafer 108 in a substantially linear fashion 113. Consequently, in one embodiment, as the wafer 108 moves as shown by rotation 112, the proximity head 106a is capable of processing (e.g., drying, cleaning, rinsing, etching, etc.) a top surface 108a of the wafer 108 using a process described in further detail in reference to FIGS. 3A–3D. Therefore, the proximity head 106a may process the wafer 108 in a substantially spiral path over the wafer 108. In another embodiment as shown in reference to FIG. 2B, there may be a second proximity head located below the wafer 108 to process the bottom surface 108b of the wafer 108. It should be understood that either of the top surface 108a or bottom surface 108b can be the "device side" upon which semiconductor devices can be formed. It should also be understood that the proximity head 106a and wafer 108 can be in any orientation (e.g., horizontal, vertical, inverted, etc.).

Figure 2B:
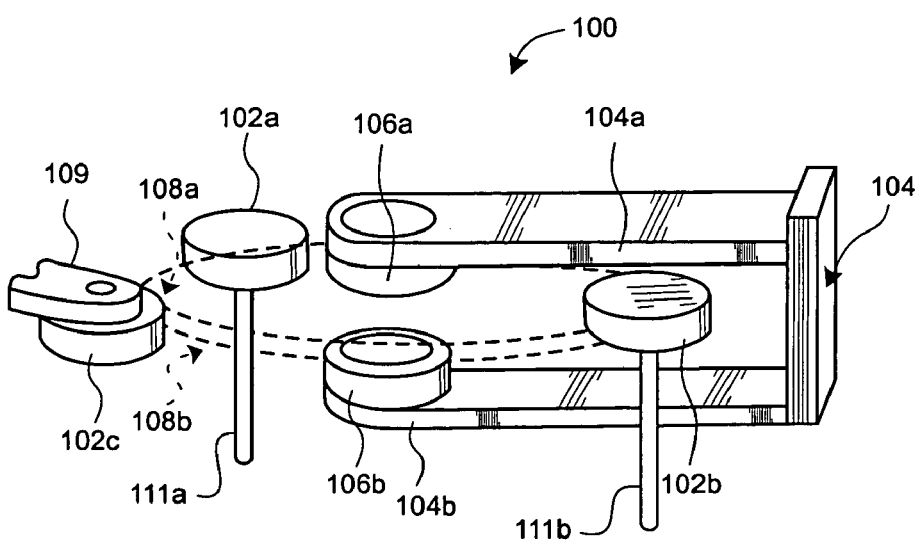
FIG. 2B is a side view of the wafer processing system with dual proximity heads in accordance with one embodiment of the present invention.

FIG. 2B is a side view of the wafer processing system 100 with dual proximity heads in accordance with one embodiment of the present invention. In this embodiment, the system 100 includes both the proximity head 106a capable of processing a top surface of the wafer 108 and the proximity head 106b capable of processing a bottom surface of the wafer 108. In one embodiment, spindles 111a and 111b along with a roller arm 109 may rotate the rollers 102a, 102b, and 102c respectively. This rotation of the rollers 102a, 102b, and 102c may rotate the wafer 108 so substantially all surfaces of the wafer 108 may be presented to the proximity heads 106a and 106b for processing.

In one embodiment, while the wafer 108 is being rotated, the proximity heads 106a and 106b are brought to close proximity of the wafer surfaces 108a and 108b by the arms 104a and 104b respectively. Once the proximity heads 106a and 106b are brought into close proximity to the wafer 108, the wafer processing may be begun. In operation, the proximity heads 106a and 106b may each add and remove fluids (e.g., water, DIW, cleaning chemistries, rinsing fluids, etching chemistries, etc.) from the wafer 108 by applying IPA, deionized water and vacuum to the top surface and the bottom surface of the wafer 108 as described in more detail in FIGS. 3A–3D below.

Figure 3A:
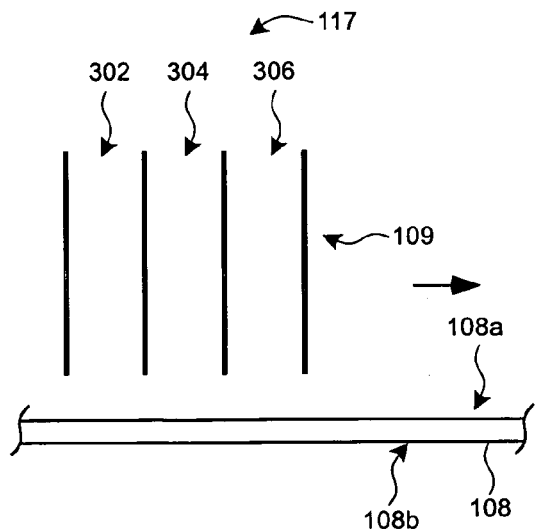
FIG. 3A shows a proximity head inlet/outlet orientation that may be utilized to process the surface of the wafer in accordance with one embodiment of the present invention.

FIG. 3A shows a proximity head inlet/outlet orientation 117 that may be utilized to process the surface 108a of the wafer 108 in accordance with one embodiment of the present invention. In one embodiment, the orientation 117 is a portion of a proximity head 106a where other source inlets 302 and 306 in addition to other source outlets 304 may be utilized in addition to the orientation 117 shown. The orientation 117 may include a source inlet 306 on a leading edge 109 with a source outlet 304 in between the source inlet 306 and the source outlet 302.

Figure 3B:
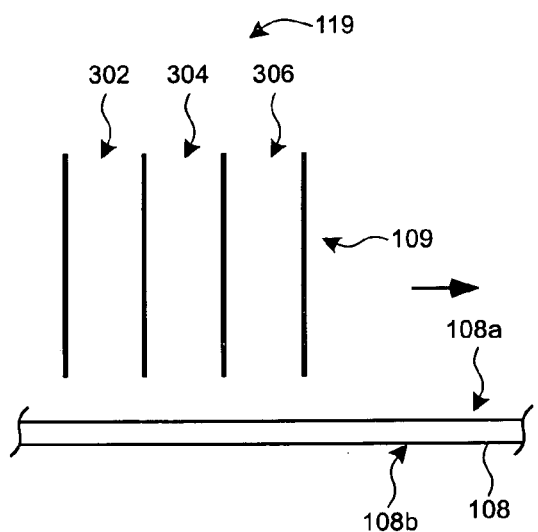
FIG. 3B shows another proximity head inlet/outlet orientation that may be utilized to process the wafer in accordance with one embodiment of the present invention.

FIG. 3B shows another proximity head inlet/outlet orientation 119 that may be utilized to process the wafer 108 in accordance with one embodiment of the present invention. In one embodiment, the orientation 119 is a portion of a proximity head 106a where other source inlets 302 and 306 in addition to other source outlets 304 may be utilized in addition to the orientation 119 shown. The orientation 119 may include a source outlet 304 on a leading edge 109 with a source inlet 302 in between the source outlet 304 and the source inlet 306.

Figure 3C:
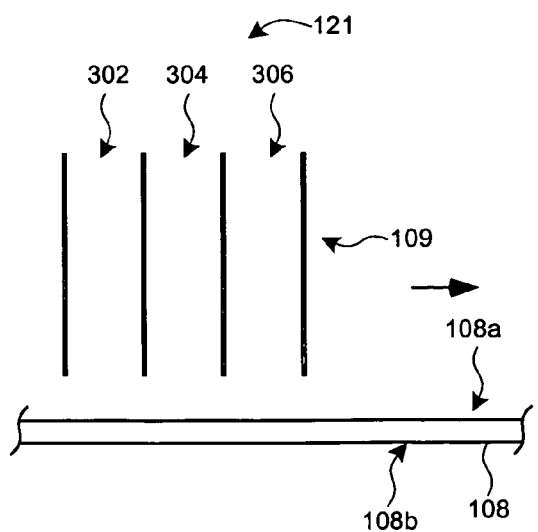
FIG. 3C shows a further proximity head inlet/outlet orientation that may be utilized to process the wafer in accordance with one embodiment of the present invention.

FIG. 3C shows a further proximity head inlet/outlet orientation 121 that may be utilized to process the wafer 108 in accordance with one embodiment of the present invention. In one embodiment, the orientation 121 is a portion of a proximity head 106a where other source inlets 302 and 306 in addition to other source outlets 304 may be utilized in addition to the orientation 119 shown. The orientation 119 may include a source inlet 306 on a leading edge 109 with a source inlet 302 in between the source outlet 304 and the source outlet 306.

Figure 3E:
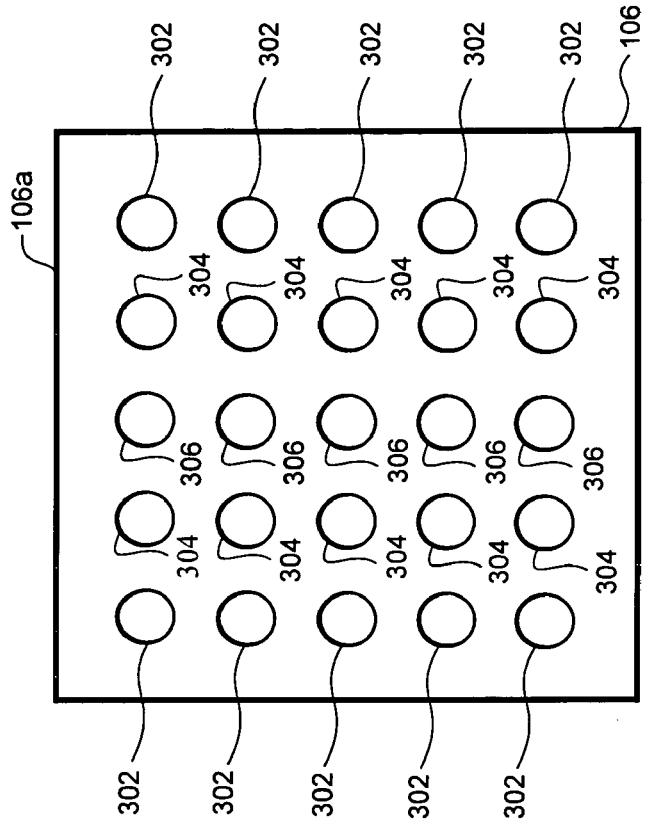
FIG. 3E shows a top view of a portion of a proximity head, in accordance with one embodiment of the present invention.
Figure 3D:
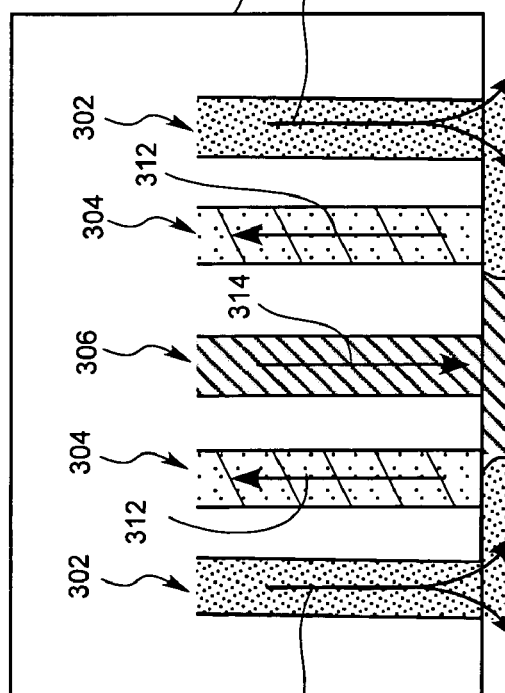
FIG. 3D illustrates a wafer process that may be conducted by a proximity head, in accordance with one embodiment of the present invention.

FIG. 3D illustrates a wafer process that may be conducted by a proximity head 106a, in accordance with one embodiment of the present invention. Although FIG. 3D shows a top surface 108a being processed, it should be appreciated that the wafer processing may be accomplished in substantially the same way for the bottom surface 108b of the wafer 108. In one embodiment in a rinsing process, a source inlet 302 may be utilized to apply isopropyl alcohol (IPA) vapor toward a top surface 108a of the wafer 108, and a source inlet 306 may be utilized to apply deionized water (DIW) toward the top surface 108a of the wafer 108. In addition, a source outlet 304 may be utilized to apply vacuum to a region in close proximity to the wafer surface to remove fluid or vapor that may located on or near the top surface 108a. It should be appreciated that any suitable combination of source inlets and source outlets may be utilized as long as at least one combination exists where at least one of the source inlet 302 is adjacent to at least one of the source outlet 304 which is in turn adjacent to at least one of the source inlet 306. The IPA may be in any suitable form such as, for example, IPA vapor where IPA in vapor form is inputted through use of a $N_2$ carrier gas. Moreover, although DIW is utilized herein, any other suitable fluid may be utilized that may enable or enhance the wafer processing such as, for example, water purified in other ways, cleaning fluids, etchant chemistries, etc.

In one embodiment, an IPA inflow 310 is provided through the source inlet 302, a vacuum 312 may be applied through the source outlet 304 and DIW inflow 314 may be provided through the source inlet 306. Therefore, an embodiment of the IPA-vacuum-DIW orientation as described above in reference to FIG. 2A is utilized. Consequently, if a fluid film resides on the wafer 108, a first fluid pressure may be applied to the wafer surface by the IPA inflow 310, a second fluid pressure may be applied to the wafer surface by the DIW inflow 314, and a third fluid pressure may be applied by the vacuum 312 to remove the DIW, IPA and the fluid film on the wafer surface.

Therefore, in one embodiment, as the DIW inflow 314 and the IPA inflow 310 is applied toward a wafer surface, any fluid on the wafer surface is intermixed with the DIW inflow 314. At this time, the DIW inflow 314 that is applied toward the wafer surface encounters the IPA inflow 310. The IPA forms an interface 118 (also known as an IPA/DIW interface 118) with the DIW inflow 314 and along with the vacuum 312 assists in the removal of the DIW inflow 314 along with any other fluid from the surface of the wafer 108. In one embodiment, the IPA/DIW interface 118 reduces the surface of tension of the DIW. In operation, the DIW is applied toward the wafer surface and almost immediately removed along with fluid on the wafer surface by the vacuum applied by the source outlet 304. The DIW that is applied toward the wafer surface and for a moment resides in the region between a proximity head and the wafer surface along with any fluid on the wafer surface forms a meniscus 116 where the borders of the meniscus 116 are the IPA/DIW interfaces 118. Therefore, the meniscus 116 is a constant flow of fluid being applied toward the surface and being removed at substantially the same time with any fluid on the wafer surface. The nearly immediate removal of the DIW and other fluids from the wafer surface prevents the formation of fluid droplets on the region of the wafer surface being dried thereby reducing the possibility of contamination drying on the wafer 108. The pressure (which is caused by the flow rate of the IPA) of the downward injection of IPA also helps contain the meniscus 116.

The flow rate of the $N_2$ carrier gas for the IPA assists in causing a shift or a push of water flow out of the region between the proximity head and the wafer surface and into the source outlets 304 through which the fluids may be outputted from the proximity head. Therefore, as the IPA and the DIW is pulled into the source outlets 304, the boundary making up the IPA/DIW interface 118 is not a continuous boundary because gas (e.g., air) is being pulled into the source outlets 304 along with the fluids. In one embodiment, as the vacuum from the source outlet 304 pulls the DIW, IPA, and the fluid on the wafer surface, the flow into the source outlet 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the IPA/DIW interface 118. It should also be understood that the any suitable number of source inlets 302, source outlets 304 and source inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should also be appreciated any suitable flow rate may be utilized for the IPA, DIW, and vacuum as long as the meniscus 116 can be maintained. In one embodiment, the flow rate of the DIW through a set of the source inlets 306 is between about 25 ml per minute to about 3,000 ml per minute and a pressure of between about 0 psi and about 40 psi. In a preferable embodiment, the flow rate of the DIW through the set of the source inlets 306 is about 400 ml per minute a pressure of between about 15 psi and about 40 psi. It should be understood that the flow rate of fluids may vary depending on the size of the proximity head. In one embodiment a larger head may have a greater rate of fluid flow than smaller proximity heads. This may occur because larger proximity heads, in one embodiment, have more source inlets 302 and 306 and source outlets 304 more flow for larger head. In one embodiment, the flow rate of the IPA vapor through a set of the source inlets 302 is between about 1 standard cubic feet per hour (SCFH) to about 100 SCFH. In a preferable embodiment, the IPA flow rate is between about 5 and 50 SCFH.

In one embodiment, the flow rate for the vacuum through a set of the source outlets 304 is between about 10 SCFH to about 1250 SCFH. In a preferable embodiment, the flow rate for a vacuum though the set of the source outlets 304 is about 350 SCFH. In an exemplary embodiment, a flow meter and/or a flow controller may be utilized to measure, monitor and even control the flow rate of the IPA, DIW, and the vacuum.

The proximity head 106a, in one embodiment, moves while in close proximity to the top surface 108a of the wafer 108 to conduct a wafer processing operation. It should be appreciated that the proximity head 106a may also be utilized to process (e.g., clean, dry, rinse, etch, etc.) the bottom surface 108b of the wafer 108. In one embodiment, the wafer 108 is rotating so the proximity head 106a may be moved in a linear fashion along the head motion while fluid is removed from the top surface 108a. Alternatively, the proximity head 106a may be substantially stationary and the wafer 108 moved (e.g., rotated). By applying the IPA 310 through the source inlet 302, the vacuum 312 through source outlet 304, and the deionized water 314 through the source inlet 306, the meniscus 116 as discussed in reference to FIGS. 3A–C may be generated.

FIG. 3E shows a top view of a portion of a proximity head 106a, in accordance with one embodiment of the present invention. In the top view of one embodiment, from left to right are a set of the source inlet 302, a set of the source outlet 304, a set of the source inlet 306, a set of the source outlet 304, and a set of the source inlet 302. Therefore, as N$_2$/IPA and DIW are inputted into the region between the proximity head 106a and the wafer 108, the vacuum removes the N$_2$/IPA and the DIW along with any fluid film that may reside on the wafer 108. The source inlets 302, the source inlets 306, and the source outlets 304 described herein may also be any suitable type of geometry such as for example, circular opening, square opening, etc. In one embodiment, the source inlets 302 and 306 and the source outlets 304 have circular openings.

Figure 4A:
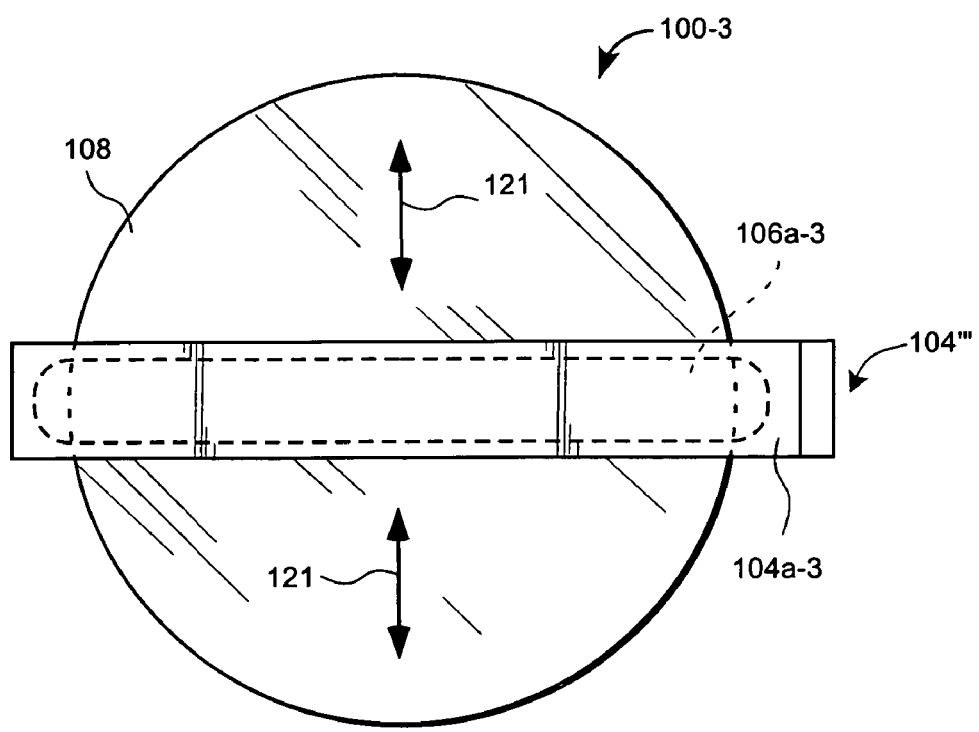
FIG. 4A shows a top view of a wafer processing system, in accordance with one embodiment of the present invention.

FIG. 4A shows a top view of a wafer processing system 100-3, in accordance with one embodiment of the present invention. The proximity heads 106a-3 and 106b-3 extend substantially across and even greater than the diameter of the wafer 108. It should be understood that the proximity heads 106a-3 and 106b-3 can be any length necessary to process the desired surface (e.g., the surface of the wafer 108). The proximity heads 106a-3 and 106b-3 can be stationary and the wafer 108 can be moved in direction 121 relative to the proximity heads. In this embodiment, the wafer 108 may be held by any suitable type of wafer holding device such as, for example, an edge grip, fingers with edge attachments, edge rollers, etc. It should also be understood that the proximity heads 106a-3 and 106b-3 and wafer 108 can be in any orientation (e.g., horizontal, vertical, inverted, etc.).

Alternatively, the proximity head carrier assembly 104''' can be configured to be movable from one edge of the wafer 108 across the diameter of the wafer 108 to an edge on the other side of the wafer 108 after crossing the entire wafer diameter. In this fashion, the proximity head 106a-3 and/or the proximity head 106b-3 (as shown below in reference to FIG. 4B) can move across the wafer following a path along a diameter of the wafer 108 from one edge to an opposite edge. It should be appreciated that the proximity heads 106a-3 and/or 106b-3 may be move from any suitable manner that would enable moving from one edge of the wafer 108 to another diametrically opposite edge. In one embodiment, the proximity head 106a-3 and/or the proximity head 106b-3 may move in directions 121. Therefore, the wafer 108 may stay stationary without any rotation or movement and the proximity heads 106a-3 and/or the proximity head 106b-3 may move into close proximity of the wafer and, through one pass over the wafer 108, clean/dry the top and/or bottom surface of the wafer 108.

Figure 4B:
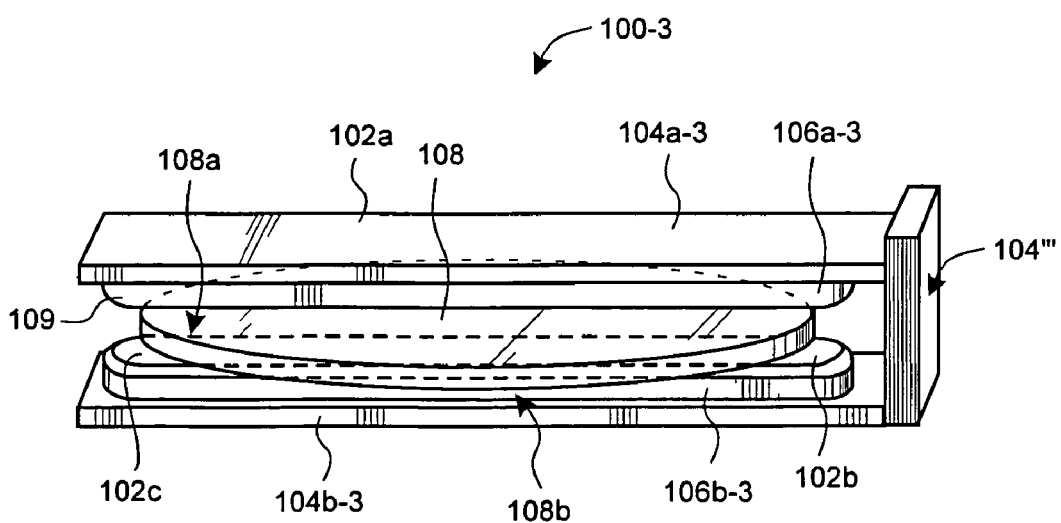
FIG. 4B shows a side view of a wafer processing system with the proximity heads in a horizontal configuration that is configured to process the wafer, in accordance with one embodiment of the present invention.

FIG. 4B shows a side view of a wafer processing system 100-3 with the proximity heads 106a-3 and 106b-3 in a horizontal configuration that is configured to process the wafer 108, in accordance with one embodiment of the present invention. In this embodiment, the proximity head 106a-3 is in a horizontal position with the wafer 108 also in a horizontal position. By use of the proximity head 106a-3 and the proximity head 106b-3 that spans the diameter of the wafer 108, or even greater, the wafer 108 may be processed in one pass by moving the wafer 108 and/or the proximity heads 106a-3 and 106b-3 in the direction 121 as discussed in reference to FIG. 4A.

Part II: Variable-Sized Dynamic Liquid Meniscus

Figure 5A:
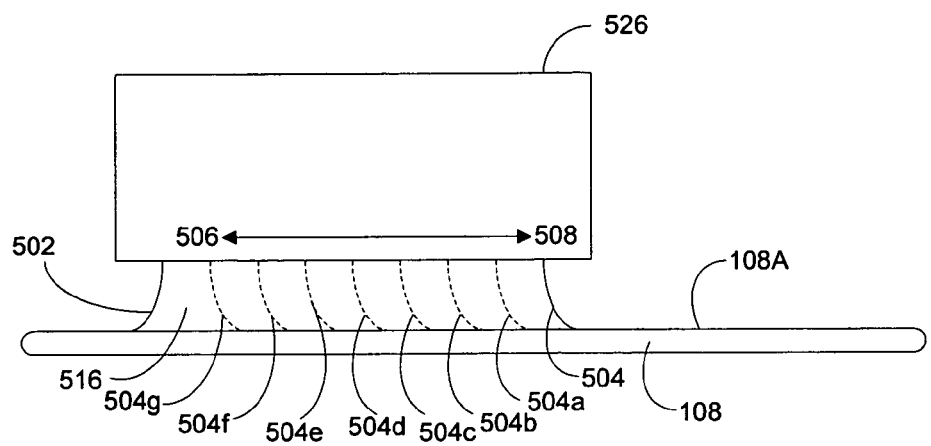
FIGS. 5A and 5B show a variable-sized dynamic liquid meniscus, in accordance with one embodiment of the present invention.
Figure 5B:
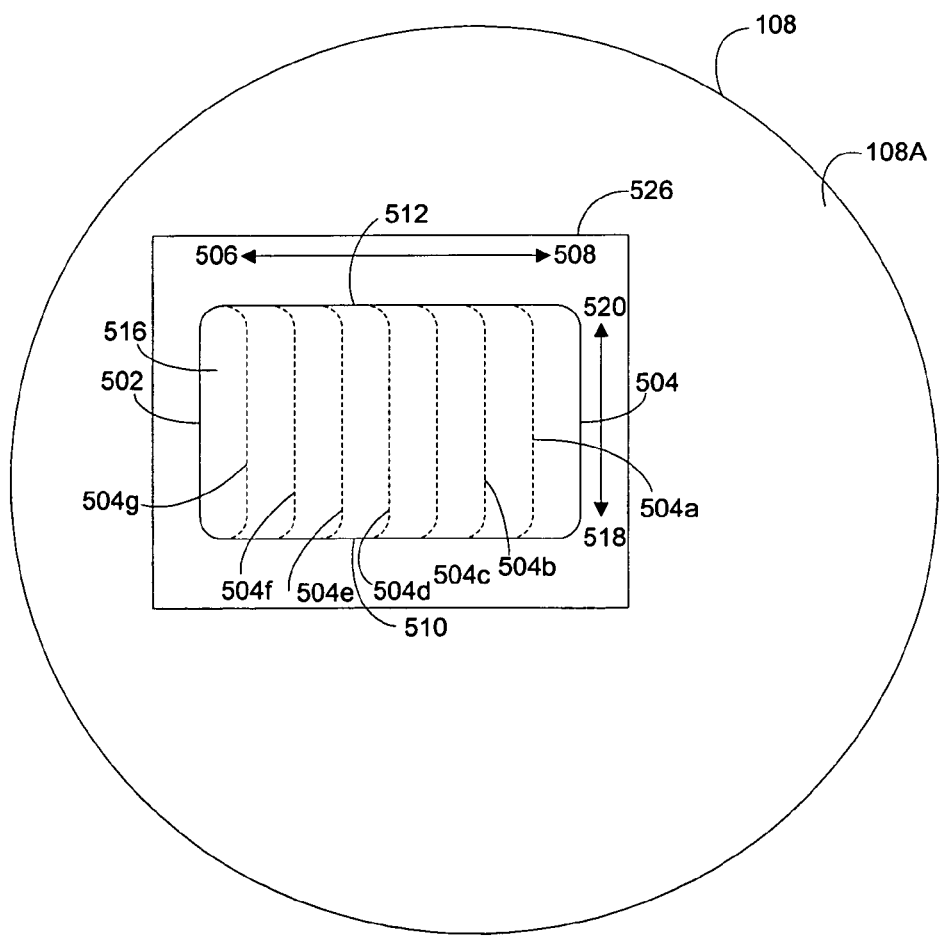

FIGS. 5A and 5B show a variable-sized dynamic liquid meniscus 516, in accordance with one embodiment of the present invention. The dynamic liquid meniscus 516 is supported between the proximity head 526 and the top surface 108A of the wafer 108 (or other surface or substrate). In alternative embodiments, the dynamic liquid meniscus 516 can also be at least partially supported between two proximity heads as will be described in more detail below. The meniscus 516 has a first edge 502 and a second edge 504. The second edge 504 can be moved relative to the first edge 502 so as to increase or decrease the size of the meniscus 516. By way of example, the meniscus 516 can be reduced in size (i.e., contracted) by moving the second edge 504 to position 504a and further contracted to positions 504b through 504g.

When the second edge is moved to position 504g, the size of the meniscus 516 is substantially minimized. When the meniscus 516 is substantially minimized, then the fluid supply to the meniscus can be reduced and gradually eliminated to completely turn off or terminate the meniscus. Since the meniscus is substantially minimized, then little to no droplets remain of the surface 108a and therefore substantially zero residue remains on the surface.

The dynamic liquid meniscus 516 can also be started in a minimum size (e.g., when the second side is in position 504g) and then the meniscus can be gradually increased in size (i.e., expanded) so as to move the second side to and through positions 504f through 504a and to position 504.

It should be understood that the meniscus 516 can be expanded or contracted in both directions 506 and 508. Further, one or both of the sides 502 and 504 of the meniscus 516 can be moved to expand or contract the meniscus 516. In one embodiment, a substantially minimized meniscus 516 can be moved across the proximity head 526 in either of directions 506 and 508. Further still, the meniscus 516 can be contracted (or expanded) in directions 520 and 518 by moving one or both of a third side 510 and a fourth side 512 of the meniscus.

Figure 6:
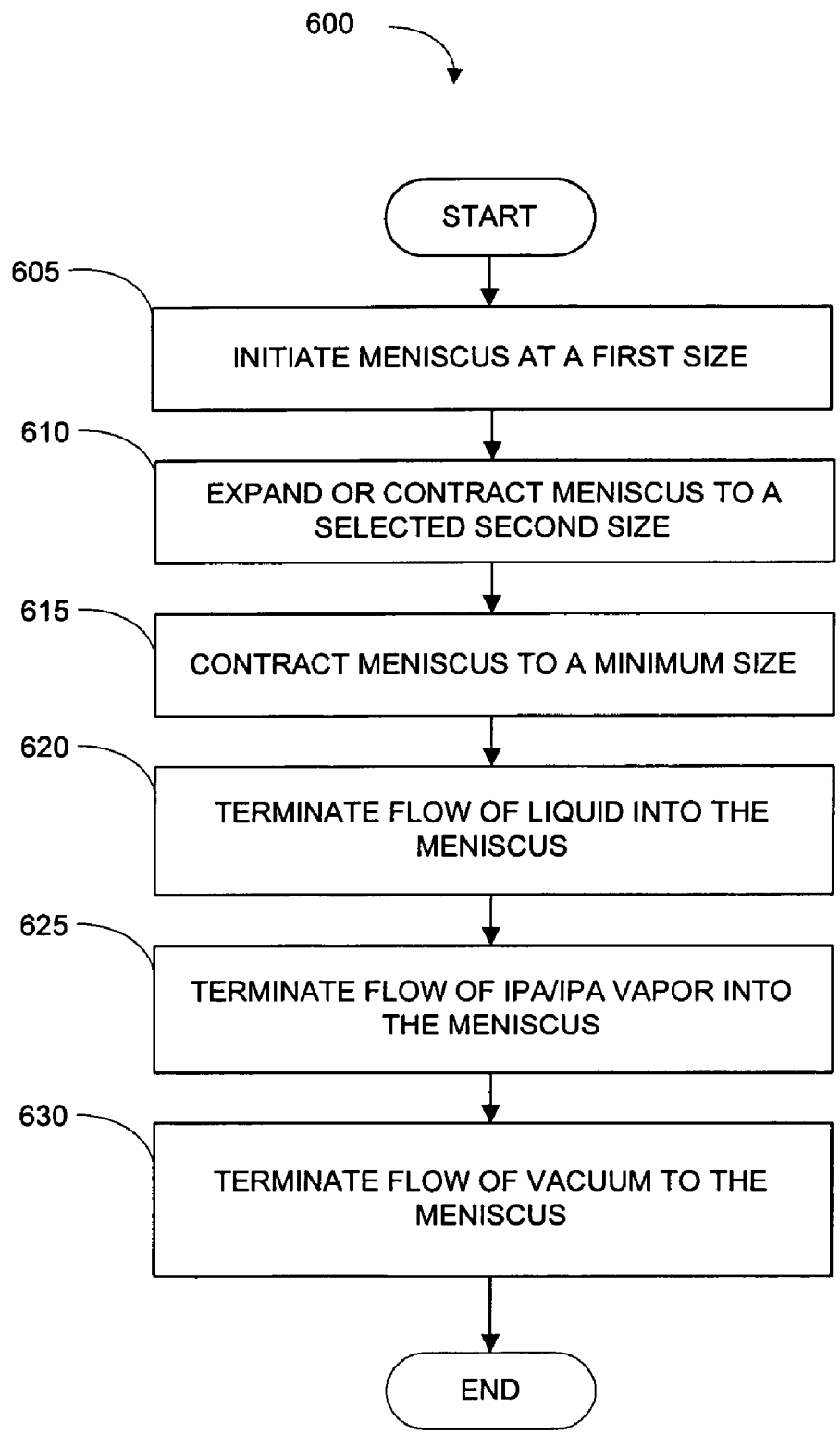
FIG. 6 is a flowchart diagram of the method operations for using a variable size dynamic liquid meniscus, in accordance with one embodiment of the present invention.

FIG. 6 is a flowchart diagram of the method operations 600 for using a variable size dynamic liquid meniscus 516, in accordance with one embodiment of the present invention. In an operation 605, the meniscus 516 is initiated in a selected first size. By way of example and referring to FIGS. 5A and 5B above, the meniscus 516 is initiated with the second side 504 in position 504d. The meniscus 516 is initiated as described above by applying vacuum, IPA/IPA vapor and fluid in the desired flow rates and pressure.

In an operation 610, the meniscus 516 is expanded or contracted to second size. By way of example, the meniscus 516 is initiated with the second side 504 in position 504f and then expanded so that the second side is in position 504b. In an optional operation 615, the meniscus 516 can be contracted to a minimum size. By way of example, the second side 504 can be contracted to position 504g.

The meniscus 516 can be terminated in operations 620–630. In operation 620, the flow of liquid into the meniscus 516 is terminated. In an operation 625, the flow of IPA/IPA vapor into the meniscus 516 is terminated. In an operation 630, the vacuum flow to the meniscus 516 is terminated.

Part III: Modulating Flow Through Multiple Ports of the Proximity Head

Controlling or modulating the flow through the various ports in the proximity head 526 can determine the size, shape and location of the variable-sized dynamic liquid meniscus 516 described in FIGS. 5A–5B above.

Figure 7A:
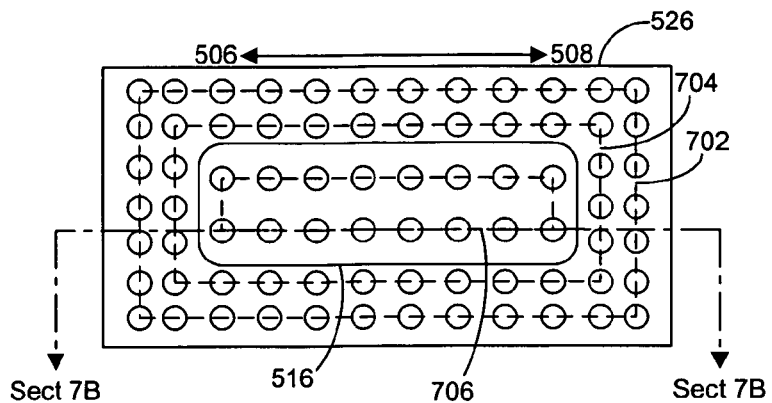
FIG. 7A is a top view of an exemplary proximity head capable of supporting a variable-sized dynamic liquid meniscus, in accordance with one embodiment of the present invention.

FIG. 7A is a top view of an exemplary proximity head 526 capable of supporting a variable-sized dynamic liquid meniscus 516, in accordance with one embodiment of the present invention. The proximity head 526 includes three "rings" of ports 702, 704 and 706. Processing fluid (e.g., DIW, cleaning chemistry, etching chemistry, etc.) are supplied through ports included in ring 706. Vacuum is applied to the ports included in ring 704. IPA/IPA vapor are supplied through the ports included in ring 702.

Figure 7B:
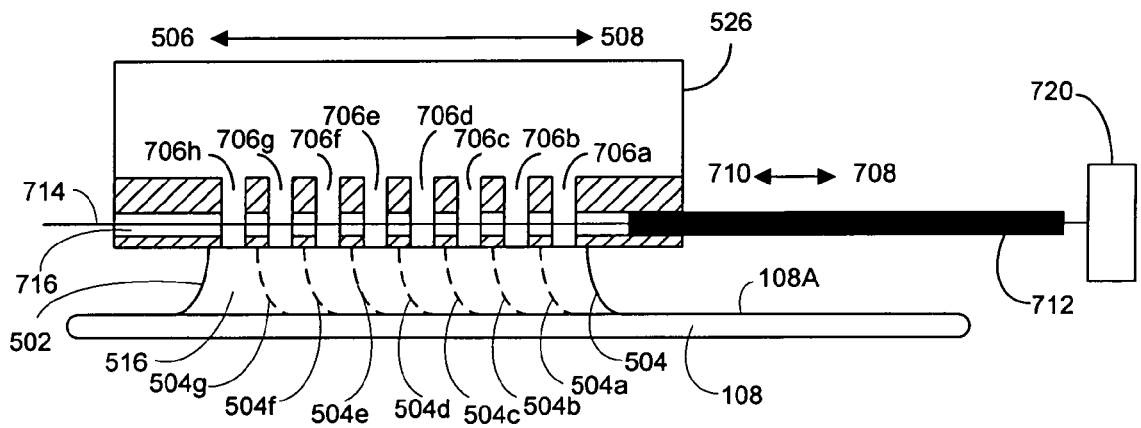
FIGS. 7B and 7C show Sect 7B—7B view of the proximity head shown in FIG. 7A, in accordance with one embodiment of the present invention.
Figure 7C:
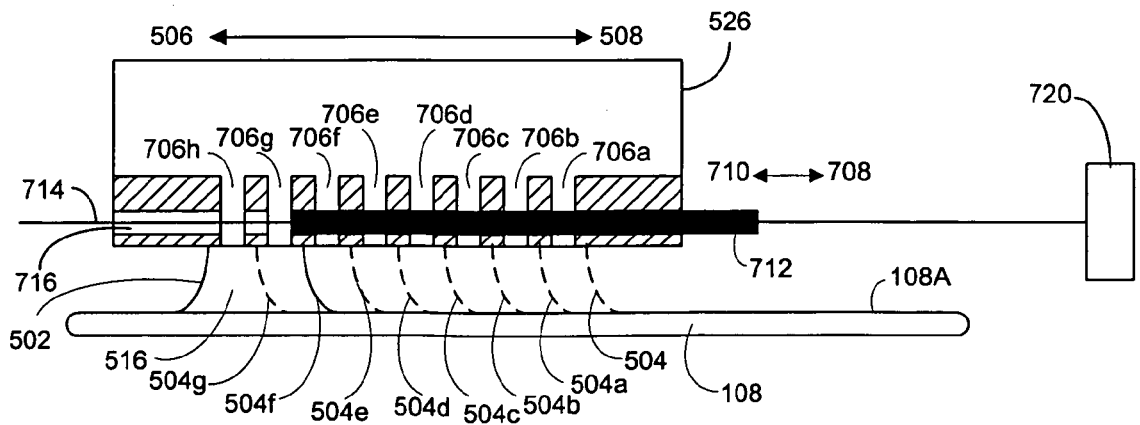

FIGS. 7B and 7C show Sect 7B—7B view of the proximity head 526 shown in FIG. 7A, in accordance with one embodiment of the present invention. The Sect 7B—7B view shows several ports 706a–706h in the ring 706. A conduit 714 intersects each of the ports 706a–706h. A flow control worm (FCW) has a first section 712 and a second section 714. The first section 712 of the FCW has a dimension sufficient to interrupt flow through the ports 706a–706h (e.g., as shown in FIG. 7C). The second section 714 has a dimension sufficiently small enough to not substantially interrupt flow through the ports 706a–706h. The FCW can be formed from any suitable material. By way of example, if the proximity head 526 is formed from Teflon, then the FCW can be formed in any material suitable for use with Teflon (e.g., Teflon, nylon, PVA, etc., and combinations thereof). By way of example, the first section 712 can be formed from PVA and the second section 714 can be a nylon monofilament line. The material used in the FCW must also be compatible with the process chemistry being used in the proximity head 526. By way of example, if the proximity head 526 is being used to perform an etching process, then the material used in the FCW must be compatible with the etch chemistry being used.

An actuator 720 is also used with the proximity head 526 and the FCW. The actuator 720 can be integrated into the proximity head 526. Alternatively, the actuator 720 can be external from the proximity head 526. The actuator 720 can move the FCW in directions 708 and 710 into the conduit 716 to interrupt or allow (e.g., modulate) the flow through the ports 706a–706h and thereby determine the size, shape and location of the meniscus 516.

By way of example, referring to FIG. 7C, the actuator 720 has moved the second section 712 of the FCW into the conduit 716 so as to substantially interrupt the flow through the ports 706a through 706f and thereby contract the size of the meniscus 516. As the second section 712 of the FCW moves in direction 710 into the conduit 716, the second side 504 of meniscus 516 is successively moved to positions 504a through 504f as the flow through the respective ports 706a through 706f is substantially interrupted.

It should also be noted that as the size of the meniscus 516 is expanded or contracted, the total flow rates of the vacuum, process fluid and IPA/IPA vapor and carrier gas may also be correspondingly increased or decreased. By way of example, if the flow through approximately one half of the ports 706a through 706f (e.g., flow through ports 706a through 706c) is substantially interrupted, then the total flow rate of the fluid being supplied to the meniscus 516 may also be reduced by about one half.

Similarly, the size of the meniscus 516 can be expanded as the second section 712 of the FCW moves in direction 708, out of the conduit 716. By way of example, as the second section 712 of the FCW moves in direction 708 out of the conduit 716, the second side 504 of meniscus 516 is successively moved from position 504f to positions 504e through 504a as the flow through the respective ports 706f through 706a is allowed to flow uninterrupted by the FCW.

It should be understood that as the pressures applied to the ports 706a through 706h in the proximity head 526 are relatively low (i.e., less than about 50 psi). Further, the physical sizes of the ports are preferably quite small. While a positive seal can be desirable, it is not necessary to positively seal one of the ports 706a through 706h to effectively interrupt the flow through that port. By way of example, the first section of FCW 712 does not have to positively seal each of the ports 706a through 706h to substantially and effectively interrupt the flow through the ports.

Figure 8A:
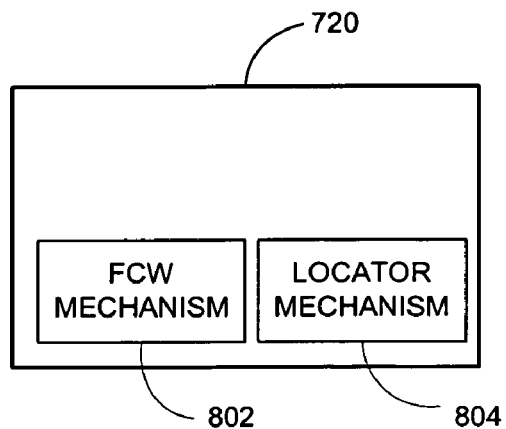
FIG. 8A is a block diagram of the actuator, in accordance with one embodiment of the present invention.

FIG. 8A is a block diagram of the actuator 720, in accordance with one embodiment of the present invention. The actuator 720 can include an FCW mechanism 802. The FCW mechanism 802 can include any mechanism suitable for moving the FCW such as, but not limited to, a motor, a solenoid or other mechanism suitable for moving the FCW. The FCW mechanism 802 can be electrically, pneumatically or hydraulically powered. By way of example a stepper motor could be used in the FCW mechanism 802 for moving the FCW. Similarly a pneumatic, vacuum or hydraulic solenoid could be used to move the FCW. The FCW mechanism 802 can also include one or more pulleys or take-up reel for reeling in or out the FCW.

The actuator 720 can also include a locator mechanism 804. The locator mechanism 804 identifies how much of the FCW is extended or retracted (i.e., the location of the FCW). The locator mechanism 804 can thereby provide feedback to a controller. By way of example, the locator mechanism 804 can scan indicators on the FCW to determine the location of the FCW. Alternatively, where the FCW mechanism 802 includes a stepper motor, the stepper motor can incorporate the location mechanism 804.

Figure 8B:
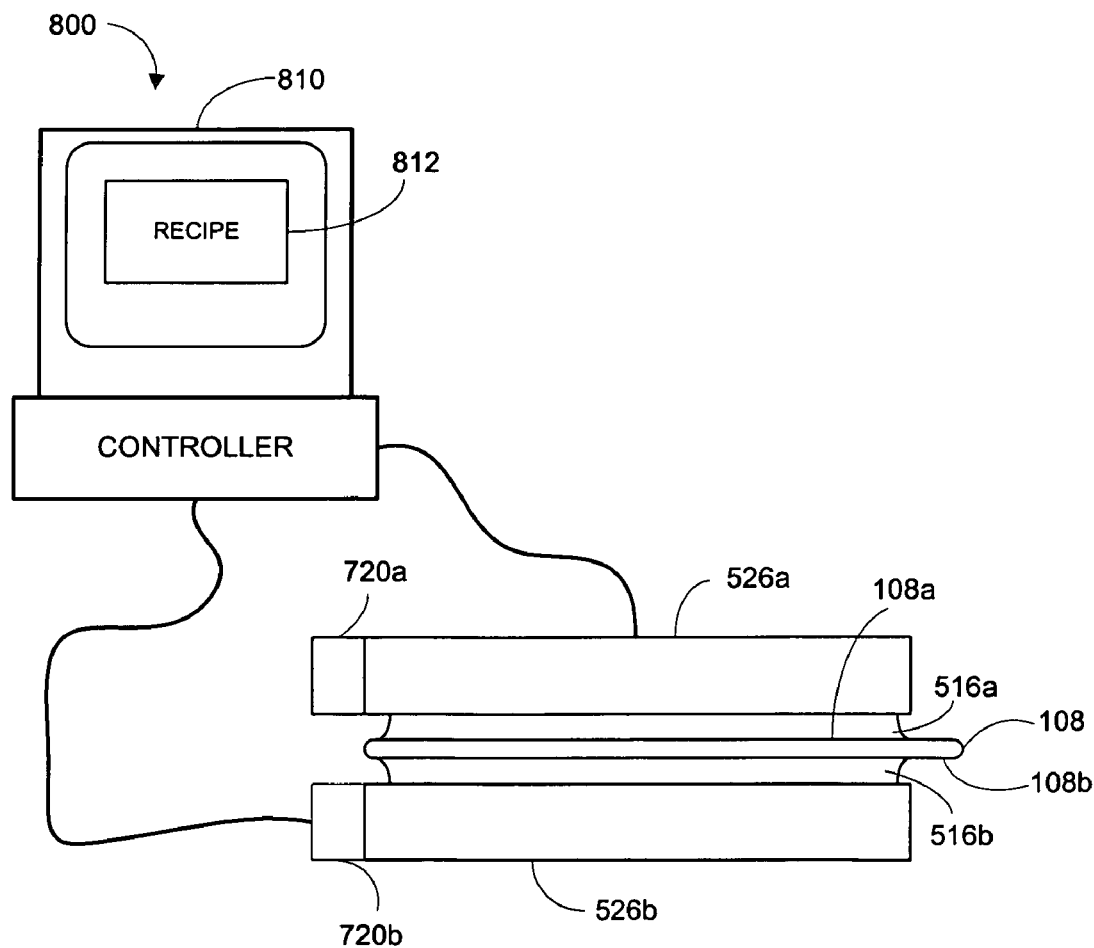
FIG. 8B is a block diagram of a system for processing a substrate, in accordance with one embodiment of the present invention.

FIG. 8B is a block diagram of a system 800 for processing a substrate, in accordance with one embodiment of the present invention. The system 800 includes two proximity heads 526a and 526b. Each of the proximity heads 526a and 526b are substantially similar to the proximity head 526 described in FIGS. 5–7C above. At least one of the two proximity heads 526a and 526b is capable of supporting a respective variable sized dynamic liquid meniscus 516a and 516b. The proximity heads 526a and 526b are arranged on respective opposing surfaces 108a and 108b of the substrate 108 (e.g., a semiconductor wafer) so as to enable the proximity heads to process both surfaces 108a and 108b of the substrate 108.

Each of the proximity heads 526a and 526b are mechanically coupled to a corresponding actuator 720a and 720b. The proximity heads 526a and 526b and actuators 720a and 720b are coupled to a system controller 810. The system controller 810 includes a recipe 812. The recipe 812 defines the operating parameters for the desired process being applied to the substrate 108. The operating parameters can include the pressures, flow rates, chemistries, size, shape and location of the variable sized dynamic liquid meniscus 516a and 516b, relative to the surfaces 108a and 108b of the substrate 108. The system controller 810 can cause the proximity heads 526a and 526b and actuators 720a and 720b to set the size, shape and location of the variable sized dynamic liquid meniscus 516a and 516b, relative to the surfaces 108a and 108b of the substrate 108.

Figure 9A:
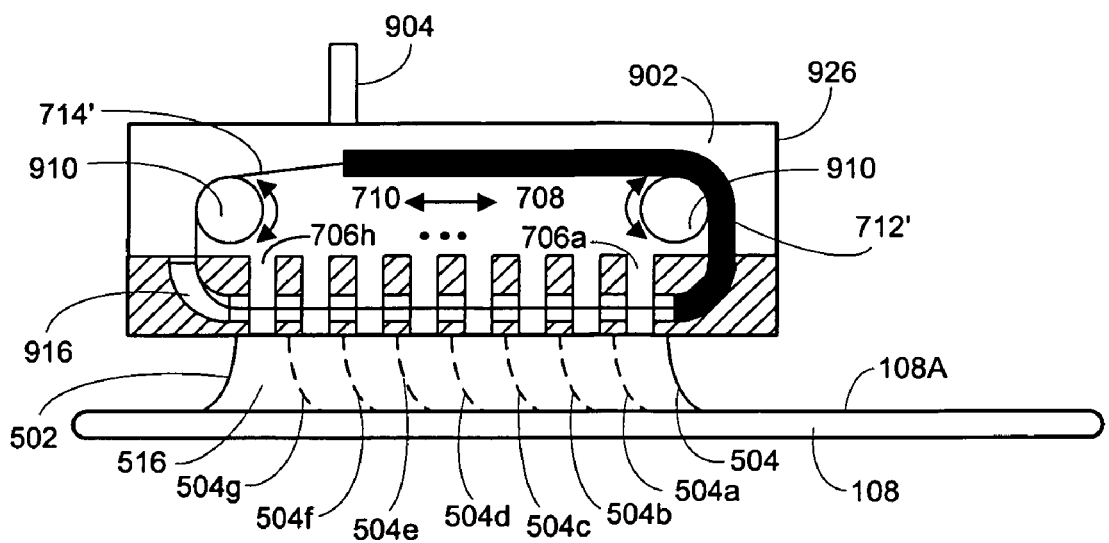
FIGS. 9A and 9B are sectional views of a proximity head, in accordance with one embodiment of the present invention.
Figure 9B:
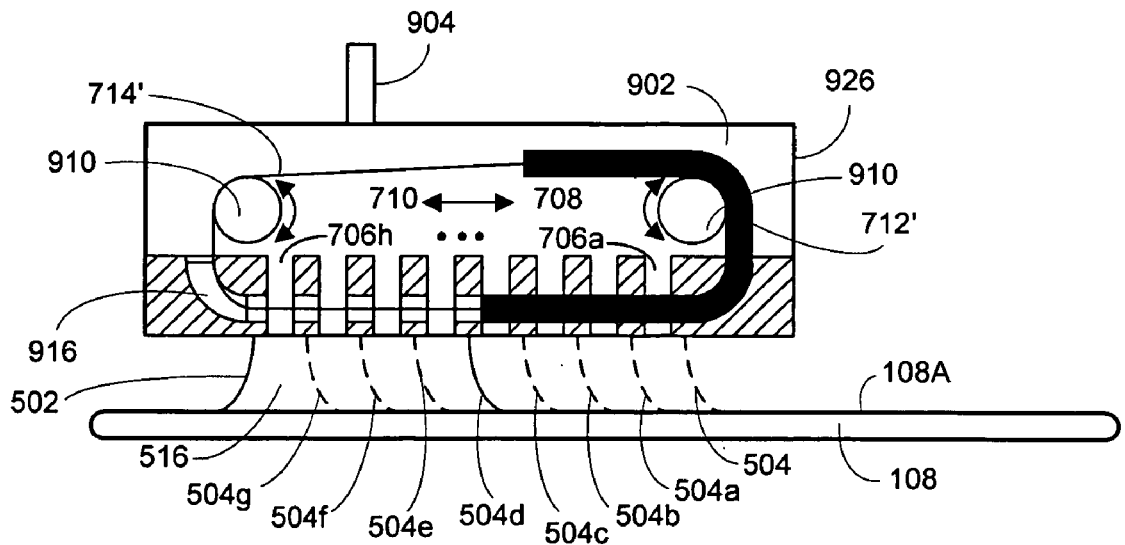

FIGS. 9A and 9B are sectional views of a proximity head 926, in accordance with one embodiment of the present invention. The proximity head 926 includes a plenum 902 that is fluidly coupled to the ports 706a through 706h. The plenum 902 provides a distribution area for the process fluid (in this instance) to be delivered to (in this instance) the ports 706a through 706h from a supply port 904.

The FCW and at least a portion of the actuator 720 is contained within the plenum 902. In this embodiment, the FCW includes the first section 712' and the second section 714' that are coupled together to form a loop. The FCW mechanism 802 includes a pair of pulleys 910 around which the first and second sections 712' and 714' of the FCW are supported. The pair of pulleys 910 can include a drive pulley and a tension pulley.

The proximity head 926 also includes a conduit 916 that begins and ends in the plenum 902. Because the conduit 916 that begins and ends in the plenum 902, then any requirement of sealing the conduit from leaking is avoided (e.g., between the ports 706a through 706h or to the outside of the proximity head 926). Avoiding the sealing issues simplifies the design and results in a more reliable proximity head 926 overall. Both of the sections 712' and 714' of the FCW can be routed around the pulleys 910 in the plenum 902 and through the conduit 916 to return to the plenum.

As shown in FIG. 9A, the smaller dimension, second section 714' of the FCW is routed through the conduit 916, across the ports 706a through 706h such that flow is substantially uninterrupted through the ports. As a result, the meniscus 516 is formed with the first side in position 502 and the second side in position 504.

Referring now to FIG. 9B, a portion of the first section 712' is routed through a portion of the conduit 916 so as to substantially interrupt flow through ports 706a through 706d. As a result, the meniscus 516 is contracted with the first side in position 502 and the second side in position 504d. As more of the first section 712' of the FCW is passed into the conduit 916, flow through subsequent ports 706e through 706h can be substantially interrupted, resulting in correspondingly contracting meniscus 516. Conversely, withdrawing the first section 712' of the FCW from the conduit 916 allows substantially uninterrupted flow to occur in respective ports 706d through 706a resulting in correspondingly expanding meniscus 516.

Figure 10A:
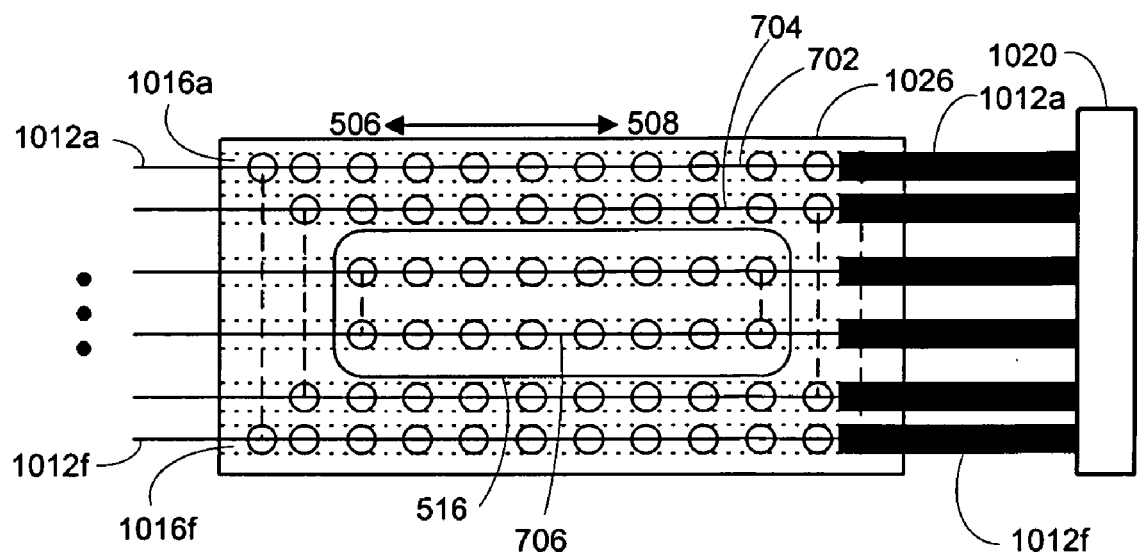
FIGS. 10A and 10B show a top view of a proximity head, in accordance with one embodiment of the present invention.
Figure 10B:
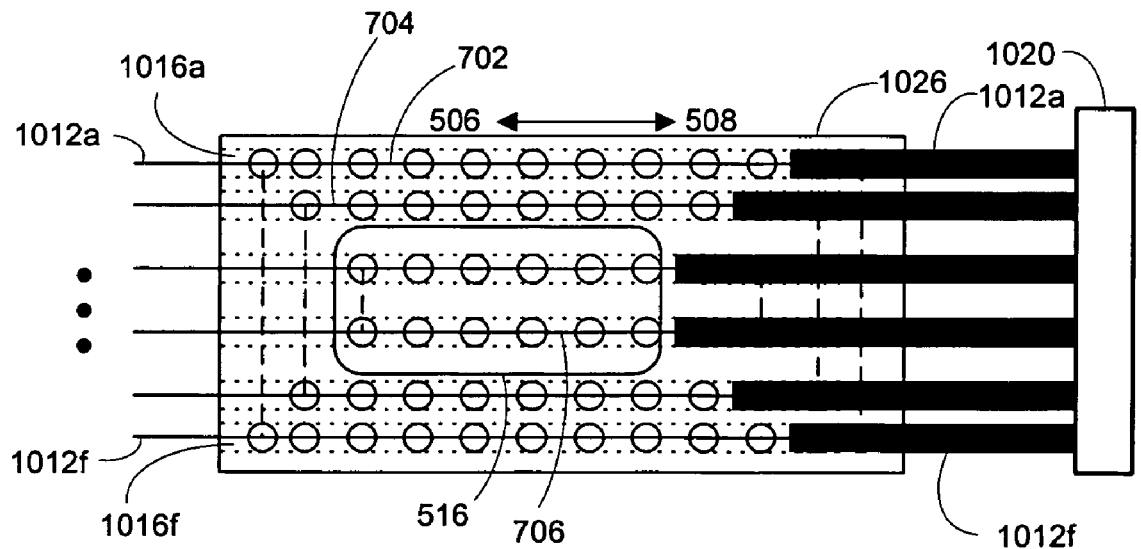

FIGS. 10A and 10B show a top view of a proximity head 1026, in accordance with one embodiment of the present invention. The proximity head 1026 includes multiple flow control worms (FCWs) 1012a through 1012f. An actuator 1020 is coupled to each of the FCWs 1012a through 1012f so as to control the location of each of the FCWs. The proximity head 1026 has two rows of ports in each of the rings 702, 704 and 706. Each of the six rows of ports has a respective conduit 1016a through 1016f through which the respective FCWs 1012a through 1012f can be passed to determine the size and shape of the meniscus 516.

As shown in FIG. 10B, the portions of respective FCWs 1012a through 1012f are passed into the conduits 1016a through 1016f to cause the meniscus 516 to contract. Also as shown in FIG. 10B, the respective locations of each of the FCWs 1012a through 1012f can be controlled independently of one another by the actuator 1020 and can thereby be used to determine the size and shape of the meniscus 516.

Figure 10C:
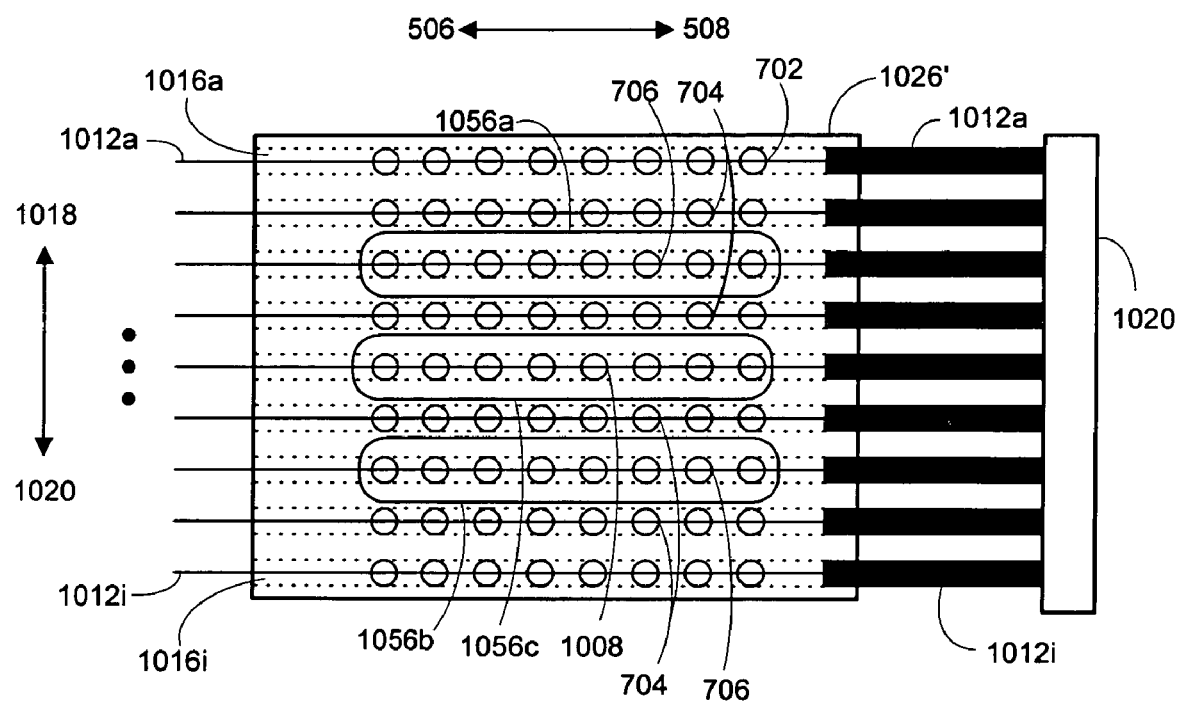
FIG. 10C is a top view of a proximity head, in accordance with one embodiment of the present invention.

FIG. 10C is a top view of a proximity head 1026', in accordance with one embodiment of the present invention. The proximity head 1026' is similar to the proximity head 1026 shown in FIGS. 10A and 10B above. However, the proximity head 1026' includes nine rows of ports: two rows of IPA/IPA vapor ports 702, four rows of vacuum ports 704, and two rows of a first process fluid ports 706 and one row of a second process fluid ports 1008. The nine rows of ports 702, 704, 706 and 1008 support two menisci. A first meniscus is a perimeter meniscus and is formed in two parts 1056a and 1056b, each part being close to the edge of the proximity head 1026'. A central meniscus 1056c is formed in the central portion of the proximity head 1026'.

Each of the two meniscus 1056a, 1056b and 1056c can be used to perform different processes. By way of example, if the second process fluid is an etching or cleaning chemistry input to ports 1008 then the central meniscus 1056c can perform a cleaning and etching process. A rinsing process can be performed by the perimeter meniscus 1056a and 1056b by providing a rinsing fluid (e.g., water, DIW, etc.) as the first processing fluid to ports 706. As the proximity head is moved in directions 1018 and 1020 relative to a surface being processed, then the central meniscus 1008 can perform the etching (or cleaning) process on the surface and the perimeter meniscus 1056a and 1056b can perform a rinsing and drying process.

Each of the nine rows of ports 702, 704, 706 and 1008 has a corresponding conduit 1016a through 1016i. A corresponding FCW 1012a through 1012i can be passed through the corresponding conduits 1016a through 1016i by the actuator 1020 so as to determine a size, shape and location of the two menisci 1056a and 1056b. The size, shape and location of the two menisci 1056a, 1056b and 1056c and determined similar to determining the size and shape of the meniscus 516 as described above in FIGS. 10A and 10B.

Figure 11A:
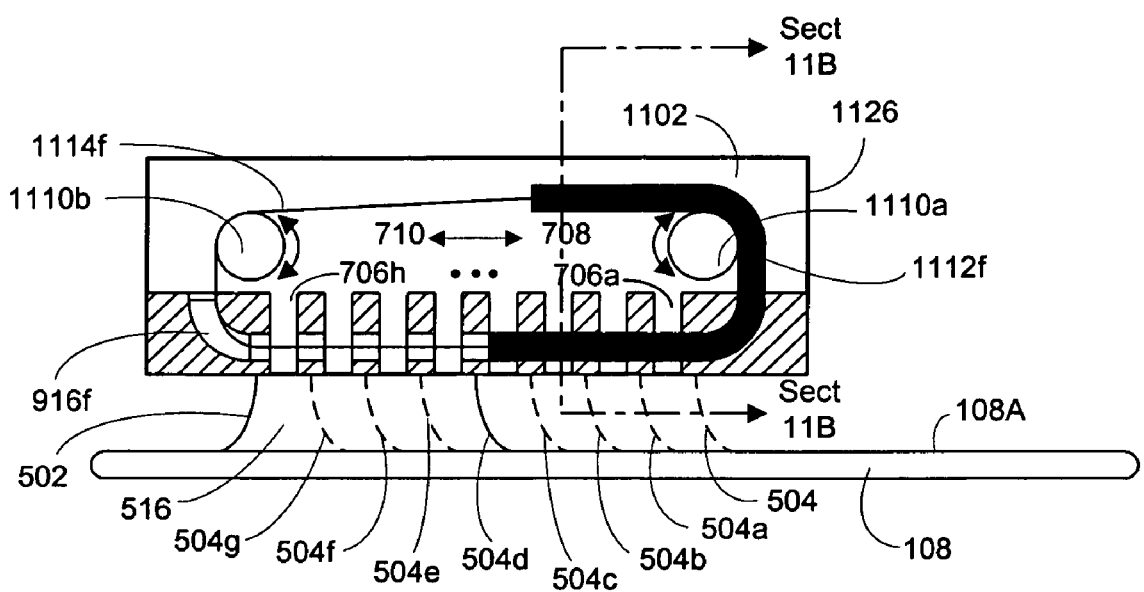
FIGS. 11A and 11B are sectional views of a proximity head, in accordance with one embodiment of the present invention.
Figure 11B:
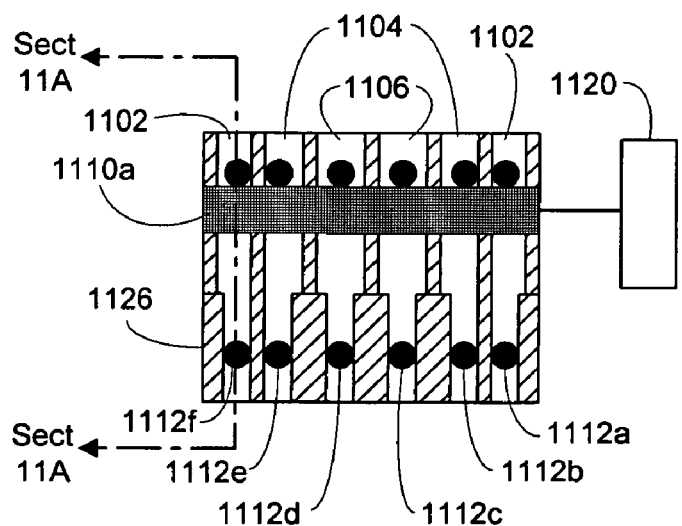

FIGS. 11A and 11B are sectional views of a proximity head 1126, in accordance with one embodiment of the present invention. Referring now to FIG. 11A, which is a section view (e.g., Sect 11A—11A shown in FIG. 11B), the proximity head 1126 is similar to the proximity head 926 described in FIGS. 9A and 9B above, with the addition of multiple FCWs 1112a through 1112f and corresponding multiple conduits 1116a through 1116f. The proximity head 1126 includes respective plenums 1102 through 1106 for each of rings 702 though 706 of ports. Each of the conduits 1116a through 1116f begin and end in their respective plenums 1102 through 1106. Each of the plenums 1102 through 1106 include one or more FCWs 1112a through 1112f and at least a portion of the FCW mechanism. The FCWs 1112a through 1112f each form a loop. The FCW mechanism includes a pair of pulleys 1110a and 1110b around which the FCWs 1112a through 1112f are supported. The FCWs 1112a through 1112f are also routed through each of the respective conduits 1116a through 1116f.

The actuator 1120 acting through the pulleys 1110a and 1110b can control each of the FCWs 1112a through 1112f independently of one another. By way of example, pulley 1110a can include multiple pulleys that are driven independently by the actuator 1120.

As shown in FIG. 11A, the smaller, second section of the FCW 1112f is routed through the conduit 1116f, across the ports 702e through 702h such that flow is substantially uninterrupted through the ports. Similarly, the larger first section of the FCW 1112f substantially interrupts flow through ports 702a through 702d. As a result, the meniscus 516 is formed with the first side in position 502 and the second side in position 504d.

Referring now to FIG. 11B, which is a sectional view (e.g., Sect 11B—11B as shown in FIG. 11A), an actuator 1120 is shown coupled to the pulley 1110a. The pulley 1110a can thereby extend and retract the FCWs 1112a through 1112*f* into or out of the respective conduits 1116*a* through 1116*f* to form the shape, size and location of the meniscus 516.

Figure 12A:
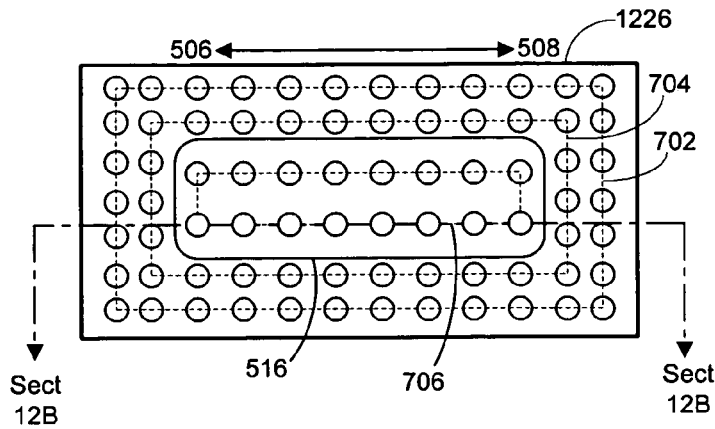
FIGS. 12A through 12C show a proximity head, in accordance with one embodiment of the present invention.
Figure 12B:
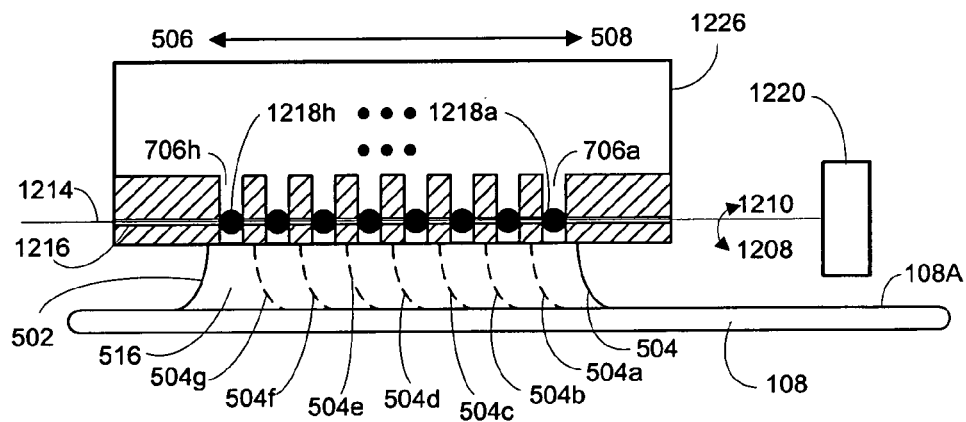
Figure 12C:
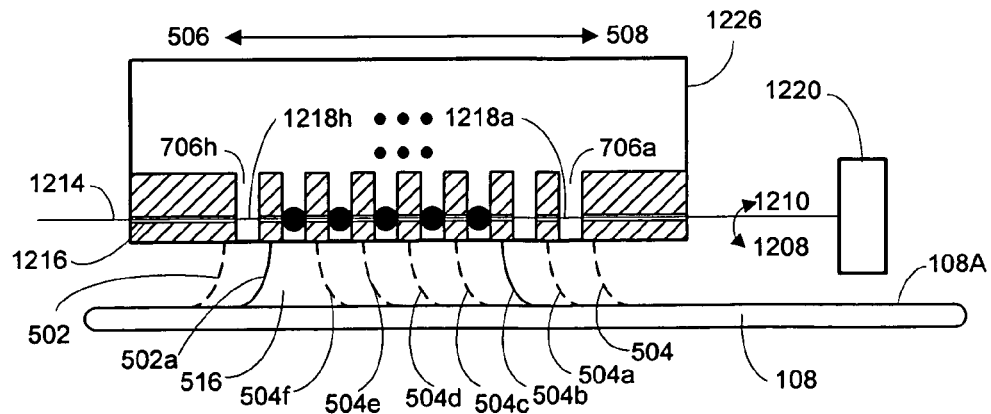

FIGS. 12A through 12C show a proximity head 1226, in accordance with one embodiment of the present invention. The proximity head 1226 is similar to the proximity head 526 described in FIGS. 7A through 7C above. The proximity head 1226 includes a shaft 1214 that extends through the conduit 1216. The shaft 1214 is coupled to an actuator 1220. The shaft 1214 includes a respective valve 1218*a* through 1218*h* in each of the ports 706*a* through 706*h*. In one embodiment, the valves 1218*a* through 1218*h* are butterfly valves. Alternatively, the valves 1218*a* through 1218*h* can be ball-type valves or any other type of valve.

The valves 1218*a* through 1218*h* can be operated together (i.e., ganged) on the shaft 1214. Alternatively, each of the valves 1218*a* through 1218*h* can be operated independently of the other. By way of example, and as shown in FIG. 12C, the butterfly valves 1218*a*, 1218*b* and 1218*h* are closed. As a result, the meniscus 516 is formed with a first edge in position 502*a* and a second edge in position 504*b*. By manipulating which of the valves 1218*a* through 1218*h* are opened and closed, the size, shape and location of the resulting meniscus 516 can be selected.

Figure 13A:
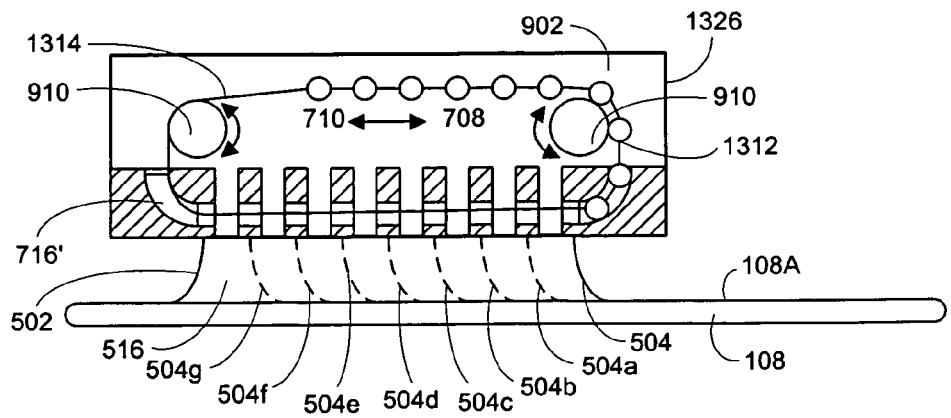
FIGS. 13A through 13C show a proximity head, in accordance with one embodiment of the present invention.
Figure 13B:
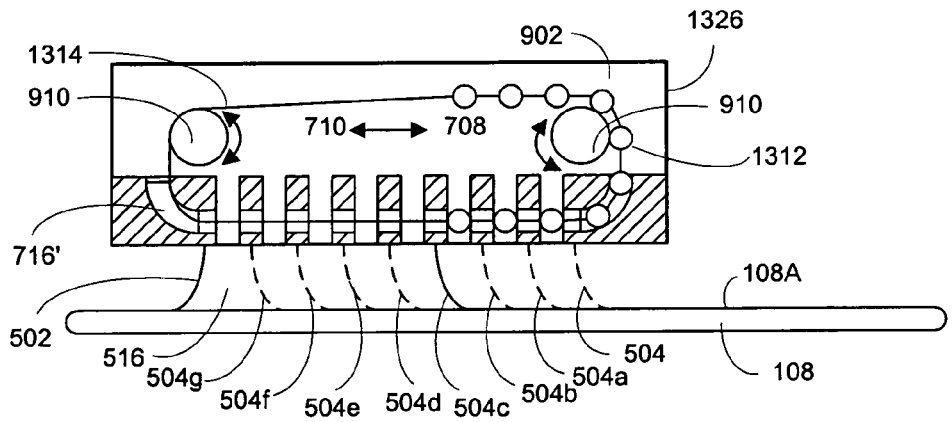
Figure 13C:
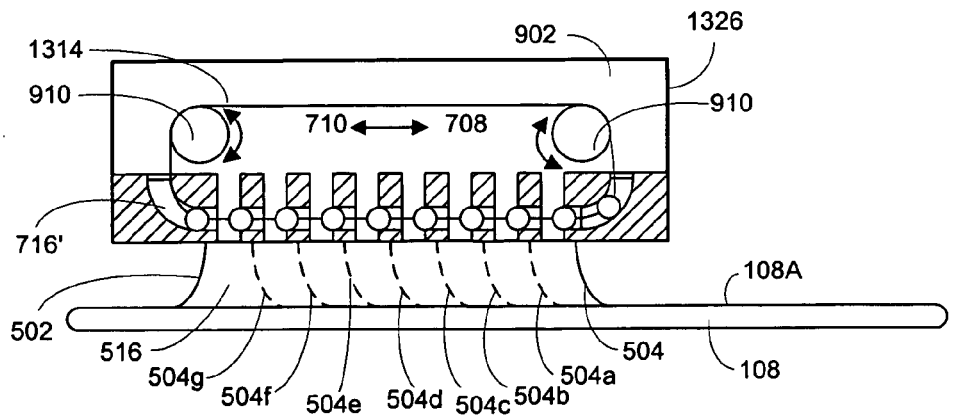

FIGS. 13A through 13C show a proximity head 1326, in accordance with one embodiment of the present invention. The proximity head 1326 is similar to the proximity head 926 described in FIGS. 9A through 9B above. The proximity head 1326 includes a FCW 1312 that includes multiple beads or balls mounted on a smaller dimension support 1314. The FCW can be moved to substantially interrupt flow through one or more of the ports 706*a* through 706*h*. By way of example and with reference to FIG. 13B, the balls have been moved through conduit 716' and into ports 706*a*, 706*b* and 706*c*. As a result, the meniscus 516 is formed with a first edge 502 and a second edge 504 at position 504*c*.

The FCW 1312 can also be used to meter flow through all of the ports 706*a* through 706*h* as shown in FIG. 13C. Each of the beads on the FCW 1312 can be moved to a position in which they partially block the flow through the ports 706*a* through 706*h*. Moving the FCW 1312 in direction 708 would substantially interrupt the flow in each of the ports 706*a* through 706*h*. Similarly, moving the FCW 1312 in direction 708 would allow substantially uninterrupted flow in each of the ports 706*a* through 706*h*. A precise control of the position of the FCW 1312 can allow precise metering of the flow through the ports 706*a* through 706*h*. Metering the flow through the ports at the ports may be desirable for some processes.

Figure 14A:
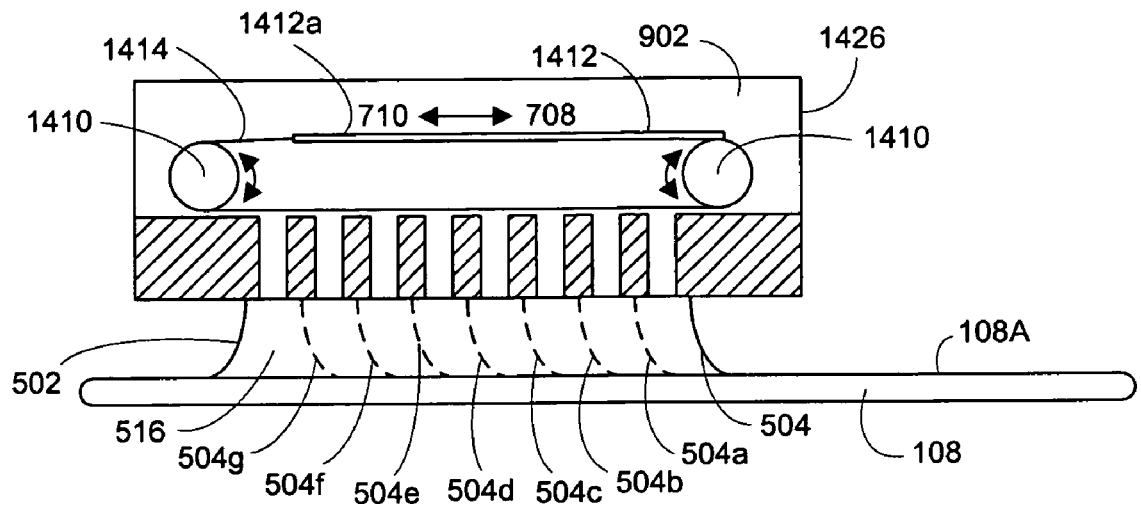
FIGS. 14A through 14B show a proximity head, in accordance with one embodiment of the present invention.
Figure 14B:
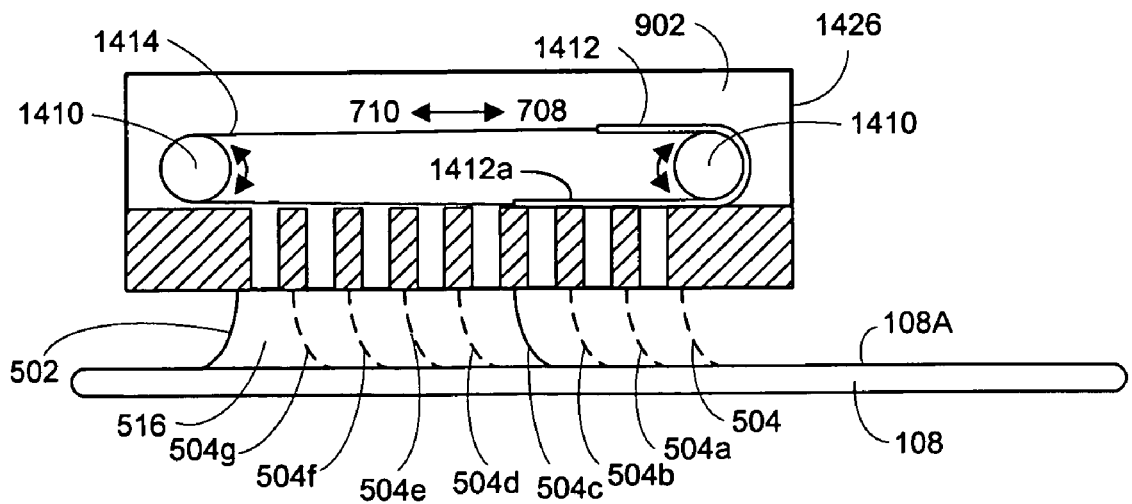

FIGS. 14A through 14B show a proximity head 1426, in accordance with one embodiment of the present invention. The proximity head 1426 is similar to the proximity head 926 described in FIGS. 9A through 9B above. The proximity head 1426 includes a FCW 1412 and a pair of pulleys 1410. The FCW 1412 includes two sections. A first section 1412*a* of the FCW 1412 is sufficiently wide enough to substantially interrupt flow into the ports 706 and through 706*h* when drawn across the openings of the ports. A second section 1414 of the FCW 1412 has a smaller dimension than the first section 1412*a*. The dimension of the second section 1414 is sufficiently small enough that the second section will not substantially interrupt the flow into the ports 706 and through 706*h* when drawn across the openings of the ports.

The pulleys 1410 are arranged to draw the FCW 1412 across the respective openings of the ports 706*a* through 706*h* in the plenum 902. As the first section 1412*a* of the FCW 1412 is drawn across the respective openings of the ports 706*a* through 706*h*, the flow through the ports is substantially interrupted. By way of example, in FIG. 14B the first section 1412*a* is drawn over the openings to ports 706*a* through 706*d*. As a result flow through the ports 706*a* through 706*c* is substantially interrupted. Further, the resulting meniscus 516 has a first side 502 and a second side 504 in position 504*c*.

As the first section 1412*a* is drawn away from the openings of the ports 706*a* through 706*h*, then the flow through the ports is substantially uninterrupted. By way of example, the smaller dimension (e.g., narrower) second section 1414 of the FCW 1412 is drawn across the openings of the ports 706*a* through 706*h*. As a result, the second side 504 of the meniscus 516 is in position 504. In this manner the size, shape and location of the meniscus 516 can be manipulated by controlling the flow through the respective ports 760*a* through 706*h* in the proximity head 1426.

Figure 15A:
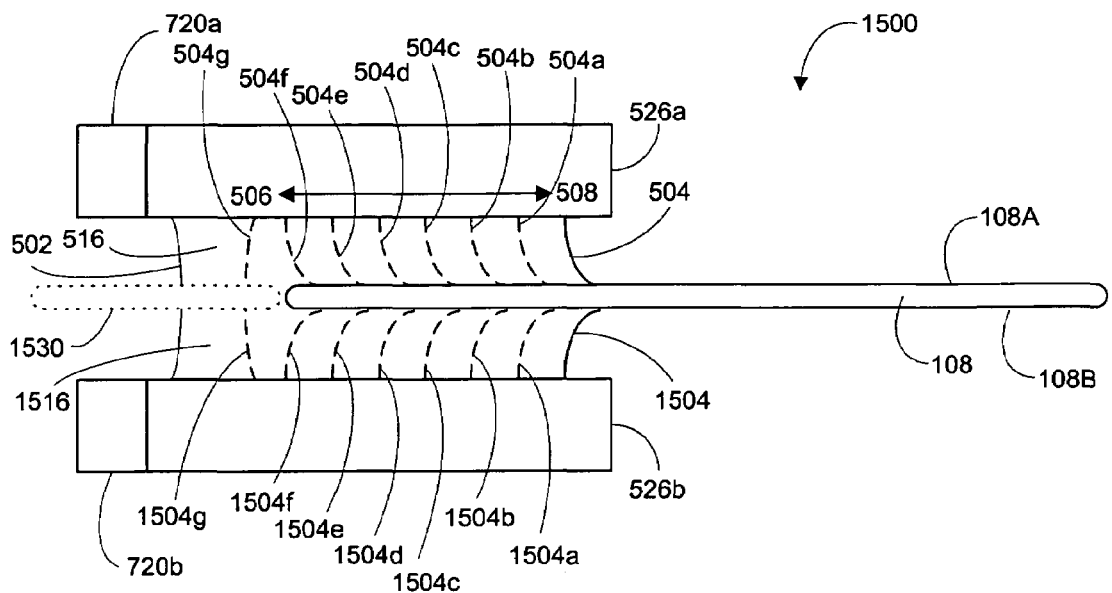
FIGS. 15A and 15B show a system for processing a substrate, in accordance with one embodiment of the present invention.
Figure 15B:
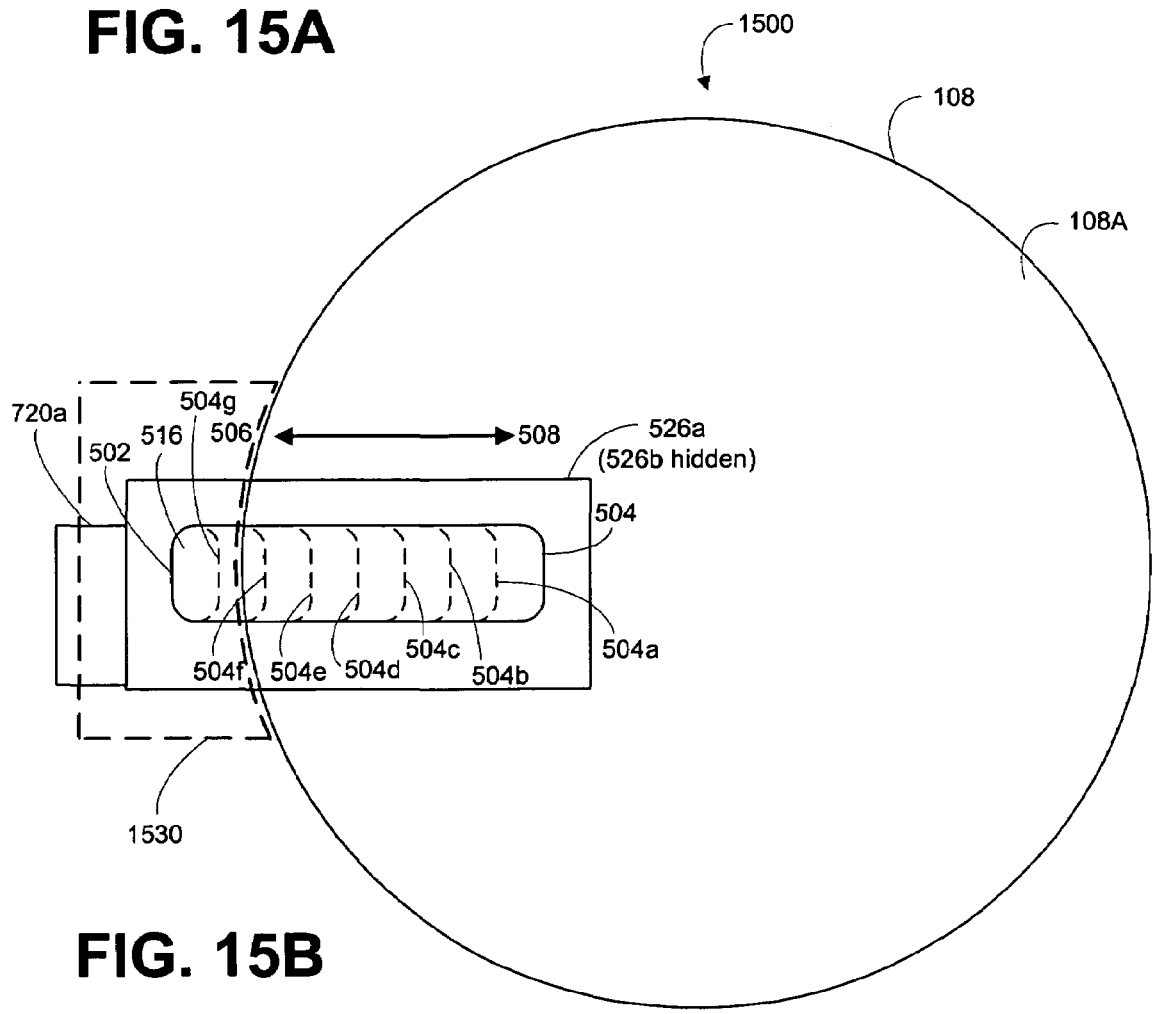
Figure 16:
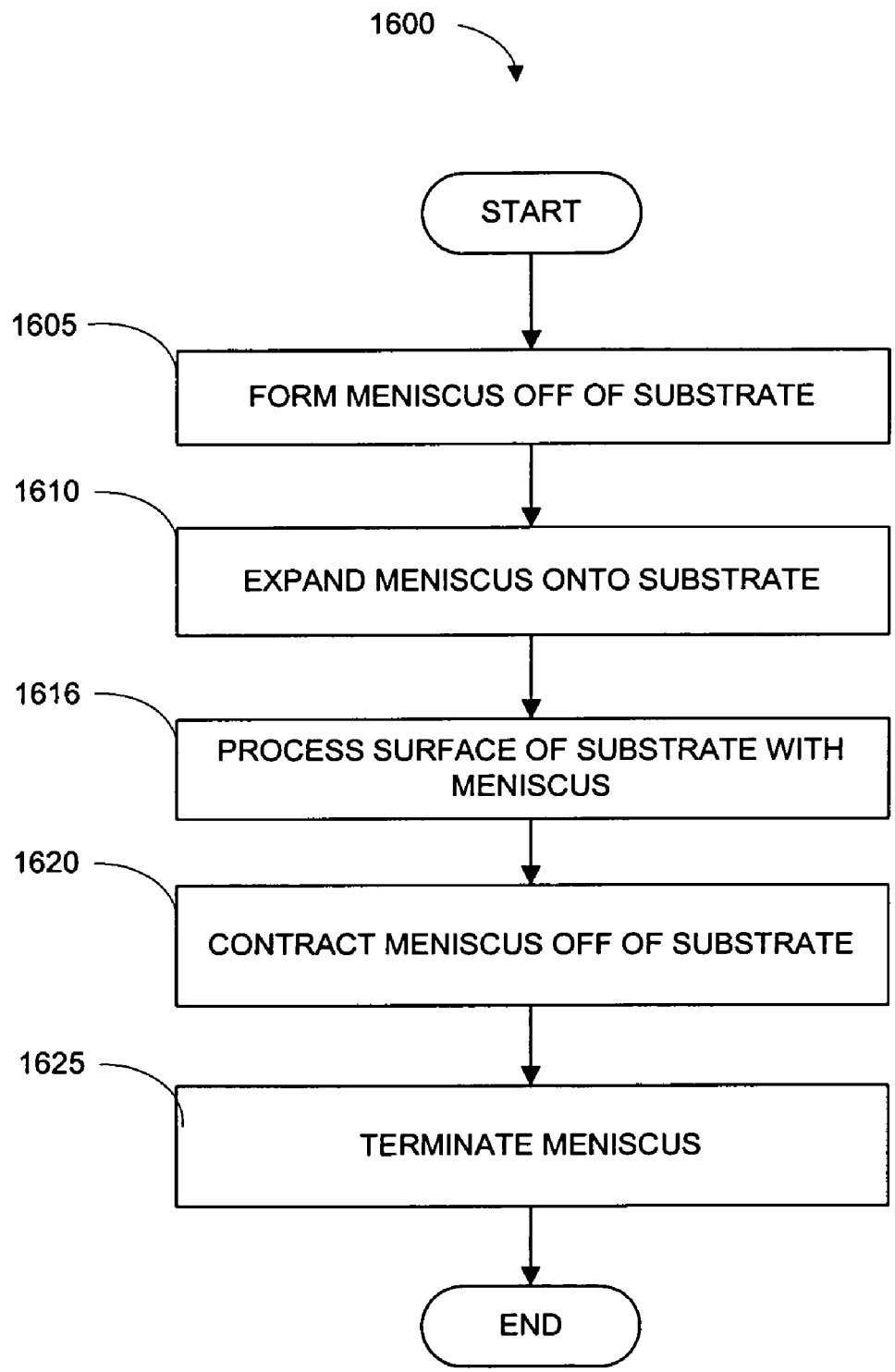
FIG. 16 is a flowchart diagram of the method operations for forming a meniscus off of the substrate, in accordance with one embodiment of the present invention.

FIGS. 15A and 15B show a system 1500 for processing a substrate, in accordance with one embodiment of the present invention. FIG. 16 is a flowchart diagram of the method operations 1600 for forming a meniscus off of the substrate 108, in accordance with one embodiment of the present invention. In an operation 1605, the system 1500 forms a meniscus 516 off of the substrate. Referring now to FIG. 15A, two proximity heads 526*a* and 526*b* are included in the system 1500. The meniscus 516 is formed between proximity heads 526*a* and 526*b* with the second side 504 of the meniscus in position 504*g*.

In an operation 1610, the meniscus is expanded onto the substrate 108. By way of example, the second side 504 of the meniscus 516 can be expanded to position 504*f*. Controlling the flow through the respective ports in the proximity heads 526*a* and 526*b* can expand the meniscus 516. As a result, the second side 504 of the meniscus is moved to subsequent positions 504*f* through 504*a* and finally into position 504. In this manner, the meniscus 516 is expanded across the top surface 108A of the substrate 108. Similarly, the meniscus 516 can also be expanded across the bottom surface 108B of the substrate 108.

It should be noted that the meniscus 516 can also be formed between the proximity head 526*a* and an optional adjacent surface 1530, without need of the second proximity head 526*b*. When used with the optional adjacent surface 1530, the meniscus is divided into a top meniscus 516 and a bottom meniscus 1516. Further, the second proximity head 526*b* can also be used with the optional adjacent surface 1530 to process the bottom surface 108*b* of the substrate 108 without need of or otherwise independent of the first proximity head 526*a*.

In an operation 1615, the surfaces 108A and 108B of the substrate 108 is processed with the meniscus 516. The substrate 108 and/or the proximity heads 526*a* and 526*b* and be moved relative to one another so as to process the entire top and bottom surfaces 108A and 108B.

In an operation 1620, the meniscus 516 can be contracted off of the substrate. By way of example, the meniscus can be contracted until the second side of the meniscus is in position 504*g* and 1504*g*.

In an operation 1625, the meniscus 516 can be terminated. In this manner, the meniscus 516 is no longer in contact with the surfaces 108A and 108B of the substrate 108 when the meniscus is terminated. As a result, any residues that may remain by a terminating the meniscus would not be left on the surfaces 108A and 108B of the substrate 108.

Figure 17A:
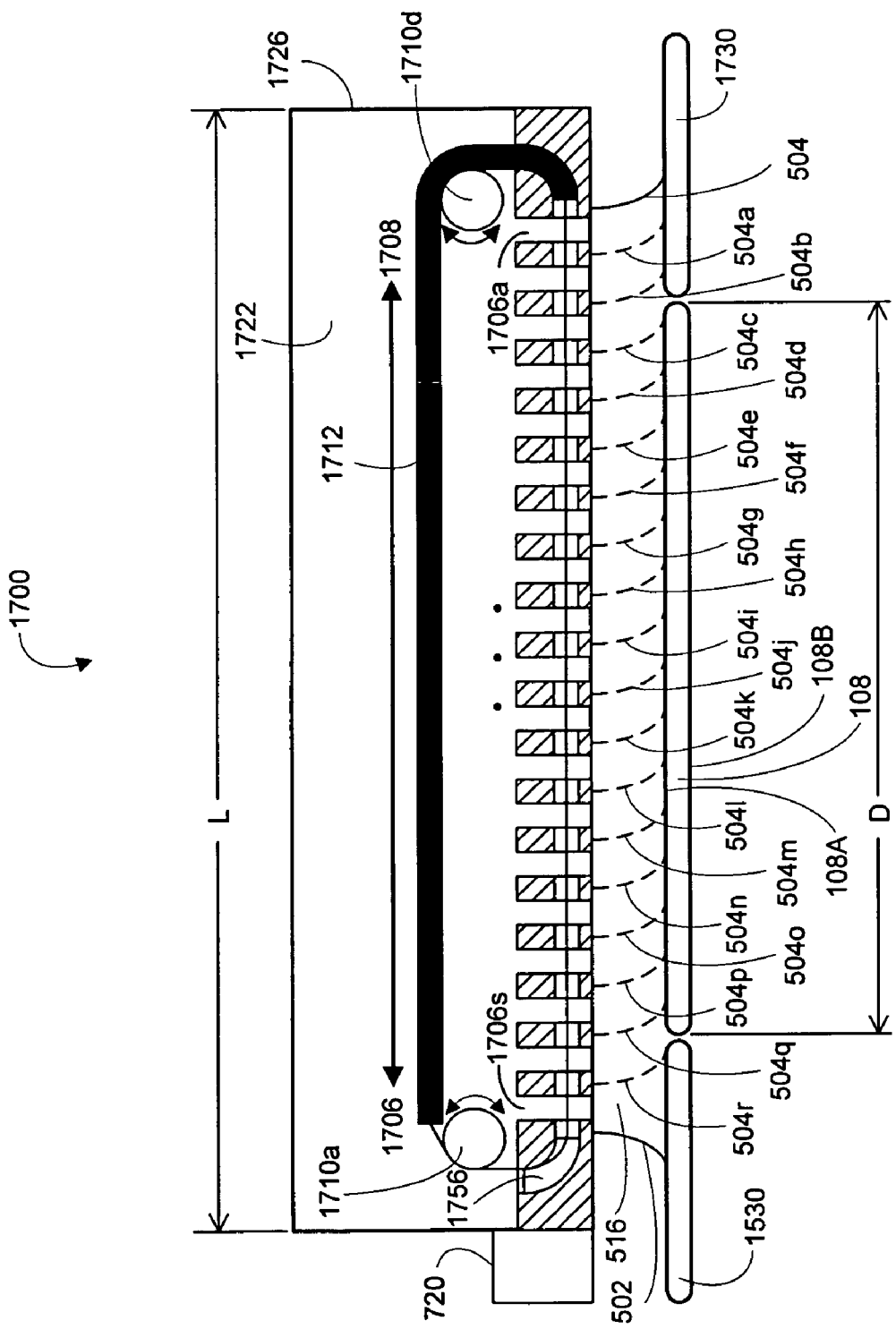
FIG. 17A is a sectional side view of a proximity head, in accordance with one embodiment of the present invention.

FIG. 17A is a sectional side view of a proximity head 1726, in accordance with one embodiment of the present invention. The proximity head 1726 has a length L that is greater than the diameter D of the substrate 108. The proximity head 1726 can therefore support a meniscus 516 that can extend across the substrate 108. The proximity head 1726 is substantially similar to the proximity head 926 shown above in FIGS. 9A and 9B. The FCW and at least a portion of the actuator 720 is contained within the plenum 1722. In this embodiment, the FCW 1712 forms a loop. The FCW mechanism 802 includes a pair of pulleys 1710$a$ and 1710$d$ around which the FCW 1712 is supported. The pair of pulleys 1710$a$ and 1710$d$ can include a drive pulley and a tension pulley.

The proximity head 1726 also includes a conduit 1716 that begins and ends in the plenum 1722. The FCW 1712 can be routed around the pulleys 1710$a$ and 1710$d$ in the plenum 1722 and through the conduit 1716 to return to the plenum.

A smaller dimension section of the FCW 1712 is routed through the conduit 1716, across the ports 1706$a$ through 1706$s$ such that flow is substantially uninterrupted through the ports. As a result, the meniscus 516 is formed with the first side in position 502 and the second side in position 504. Passing the FCW 1712 through the conduit 1716 can cause the size, shape and location of the meniscus 516 similar to that described above in FIGS. 5$a$ through 9B above. Passing the FCW 1712 through the conduit 1756 can cause the second side 504 of the meniscus 516 to move through positions 504$a$ through 504$r$.

By way of example, the FCW 1712 can be passed through the conduit 1756 so as to substantially interrupt the flow through ports 1706$a$ through 1706$r$ causing the second side 504 of the meniscus 516 to be moved to position 504$r$. In one embodiment, the meniscus 516 can be formed with the second side 504 in position 504$r$. The meniscus 516 can thereby be formed off of the substrate 108 and on the adjacent surface 1530. Sequentially allowing substantially uninterrupted flow through ports 1706$q$ through 1706$a$ can gradually expand the meniscus 516 across the substrate 108 to another adjacent surface 1730. In this manner the meniscus 516 can be expanded and contracted across the substrate 108.

Figure 17B:
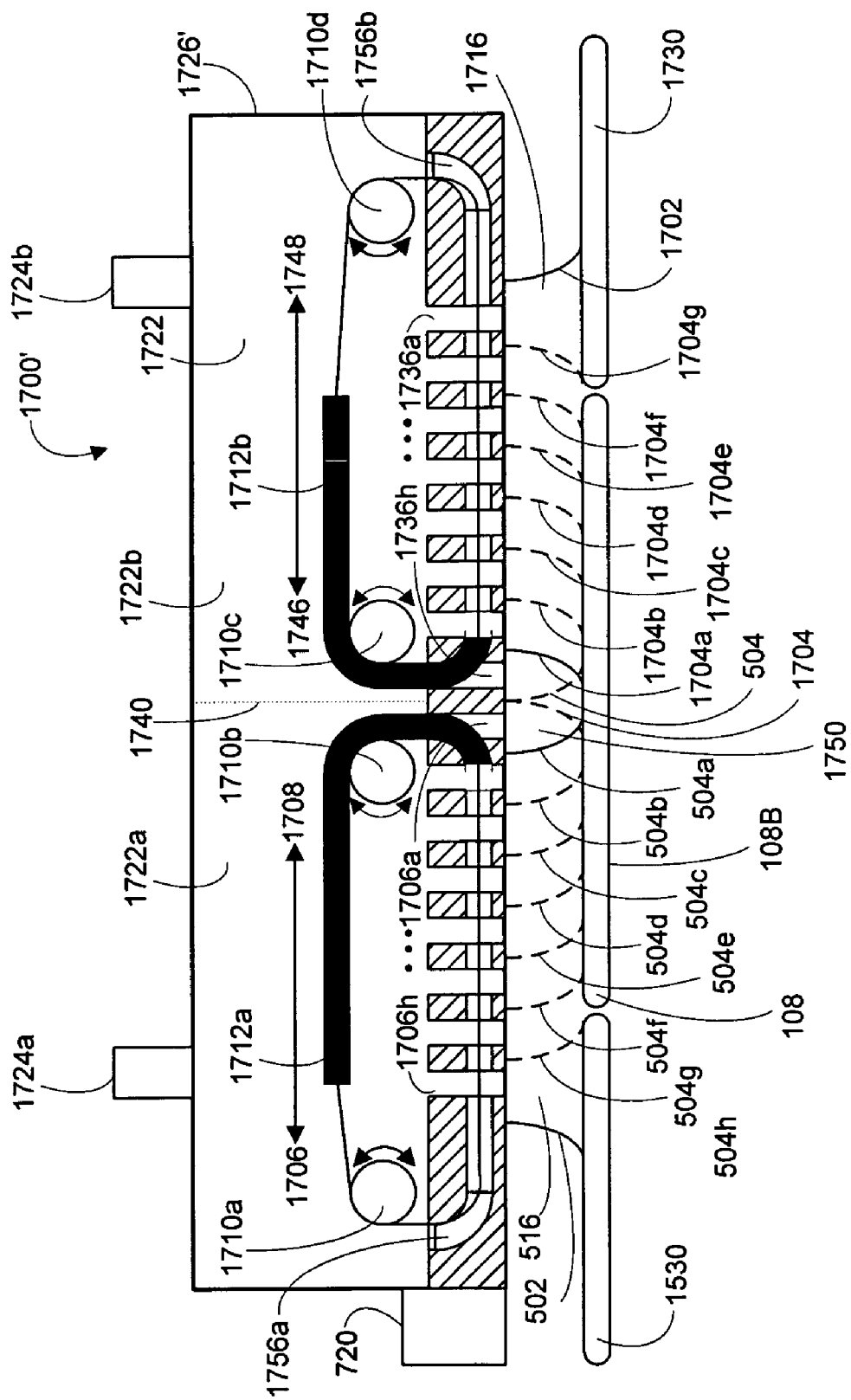
FIG. 17B is a sectional side view of a proximity head, in accordance with one embodiment of the present invention.

FIG. 17B is a sectional side view of a proximity head 1726', in accordance with one embodiment of the present invention. The proximity head 1726' includes a first set of ports 1706$a$ through 1706$h$ and a second set of ports 1736$a$ through 1736$h$. The proximity head 1726' can thereby support two menisci 516 and 1716. Each of the sets of ports 1706$a$ through 1706$h$ and 1736$a$ through 1736$h$ has a respective FCW 1712$a$ and 1712$b$ which can control the respective size, shape and location of the two menisci 516 and 1716. By way of example, meniscus 516, can be formed on the adjacent surface 1530 and then expanded across the substrate 108. Similarly, the meniscus 1716 can be formed on the second adjacent surface 1730 and expanded across the substrate 108. The FCWs 1712$a$ and 1712$b$ can be controlled independently or together.

While the menisci 516 and 1716 are shown with a significant gap 1750 separating them, it should be understood that the menisci 516 and 1716 could actually be formed to meet in the middle or at least to minimize the size of the gap 1750. By way of example, allowing substantially uninterrupted flow through ports 1706$a$ and 1736$h$ would move the respective second sides 504 and 1704 of the menisci 516 and 1716 to positions 504 and 1704, respectively. In this manner the menisci 516 and 1716 can extend across the substrate 108. In one embodiment, the plenum 1722 can be divided into two plenums 1722$a$ and 1722$b$ (e.g., by divider 1740. The first set of ports 1706$a$ through 1706$h$ can be supplied by the first plenum 1722$a$ and the second set of ports 1736$a$ through 1736$h$ can be supplied by the second plenum 1722$b$. In this embodiment, each of the two menisci can support separate processes at the same time.

It should be understood that while a looping FCW 1712, 1712$a$ and 1712$b$ is shown in FIGS. 17A and 17B as one embodiment to modulate the flow through the ports in the proximity heads. Other methods and apparatus of modulating the flow through the ports in the proximity heads can also be used. By way of example, the multiple valves (e.g., as shown in FIGS. 12A–12C), or a non-loop FCW (e.g., as shown in FIGS. 7A–7C and 10A–10C), or beads (e.g., as shown in FIGS. 13A–13C), or even a looping FCW that does not use a conduit (e.g., as shown in FIGS. 14A–14B) can be used to modulate the flow through the ports in the proximity heads.

It should be understood that the drawings of the various embodiments contained herein may not be drawn to scale so as to more easily allow description of the various features and operations herein. By way of example the meniscus 516 described herein is shown with a drastically exaggerated thickness (dimension between the proximity head and the surface being processed).

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data that can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a dynamic liquid meniscus comprising:
   forming a meniscus at a first size, the meniscus being formed between a proximity head and a first surface; and
   changing the meniscus to a second size by modulating a flow through at least one of a plurality of ports in the proximity head.

2. The method of claim 1, wherein the meniscus is formed on the first surface and wherein the meniscus is expanded to the second size, wherein the second size is formed between the proximity head and at least a portion of a second surface, wherein the second surface is a surface to be processed.

3. The method of claim 1, wherein the first size is smaller than the second size.

4. The method of claim 1, further comprising, contracting the meniscus to a minimum size.

5. The method of claim 4, further comprising terminating the meniscus.

6. The method of claim 4, wherein the minimum size meniscus is formed between the first surface and the proximity head and wherein the first surface is not a surface to be processed.

7. The method of claim 1, wherein changing the meniscus to the second size by modulating the flow through at least one of the plurality of ports in the proximity head includes moving the meniscus relative to the proximity head.

8. The method of claim 1, wherein changing the meniscus to the second size by modulating the flow through at least one of the plurality of ports in the proximity head includes changing a respective total flow rate supplied to the plurality of ports.

9. The method of claim 1, further comprising processing the first surface including moving the first surface relative to the proximity head.

10. The method of claim 9, wherein the proximity head is stationary.

11. The method of claim 1, wherein changing the meniscus to the second size by modulating the flow through at least one of the plurality of ports in the proximity head includes modulating the flow through at least one of the plurality of ports in the proximity head with a flow control worm.

12. The method of claim 11, wherein the flow control worm passes through a conduit to enable the enabling and disabling of selected ones of the plurality of ports.

13. The method of claim 11, wherein the flow control worm has a width equal to or greater than a port width of each one of the plurality of ports.

14. The method of claim 13, wherein the width of flow control worm is constant along a length of the flow control worm.

15. The method of claim 13, wherein the width of flow control worm varies along a length of the flow control worm.

16. The method of claim 11, wherein the flow control worm includes a plurality of beads.

17. The method of claim 11, wherein the flow control worm includes a plurality of valves.

18. The method of claim 17, wherein each one of the plurality of valves can be actuated independent of one another.

19. A method of forming a dynamic liquid meniscus comprising:
   forming a meniscus at a first size, the meniscus being formed between a proximity head and a first surface, the proximity head having a plurality of ports, wherein a first plurality of fluid flow rates is supplied to the meniscus through the plurality of ports; and
   changing the first plurality of fluid flow rates to a second plurality of fluid flow rates by modulating a flow through at least one of the plurality of ports in the proximity head.

20. A proximity head system for flowing fluids to and from a surface of a substrate so as to define a meniscus, the proximity head comprising:
   a plurality of ports for flowing the fluids to and from the meniscus formed between the proximity head and the surface of the substrate, each one of the plurality of ports including a corresponding one of a plurality of valves.

* * * * *